US008372525B2

(12) United States Patent
Lecloux et al.

(10) Patent No.: US 8,372,525 B2
(45) Date of Patent: Feb. 12, 2013

(54) ORGANIC ELECTRONIC DEVICE

(75) Inventors: Daniel David Lecloux, Wilmington, DE (US); Reid John Chesterfield, Wilmington, DE (US); Jeffrey A. Merlo, Wilmington, DE (US); Eric Maurice Smith, Hockessin, DE (US); Nora Sabina Radu, Landenberg, PA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 418 days.

(21) Appl. No.: 11/939,015

(22) Filed: Nov. 13, 2007

(65) Prior Publication Data
US 2008/0138655 A1    Jun. 12, 2008

Related U.S. Application Data

(60) Provisional application No. 60/858,785, filed on Nov. 13, 2006.

(51) Int. Cl.
*H01L 51/50* (2006.01)
(52) U.S. Cl. ........ 428/660; 428/917; 313/504; 313/505; 313/506; 257/40; 257/E51.05
(58) Field of Classification Search .................. 428/690, 428/917; 313/504, 505, 506; 257/40, E51.05
See application file for complete search history.

(56) References Cited

U.S. PATENT DOCUMENTS

| 5,962,631 | A | 10/1999 | Woo et al. | |
|---|---|---|---|---|
| 6,303,238 | B1 | 10/2001 | Thompson et al. | |
| 6,670,645 | B2 | 12/2003 | Grushin et al. | |
| 2001/0026878 | A1* | 10/2001 | Woo et al. | 428/690 |
| 2002/0048688 | A1 | 4/2002 | Fukuoka et al. | |
| 2004/0007971 | A1 | 1/2004 | Higashi et al. | |
| 2004/0102577 | A1 | 5/2004 | Hsu et al. | |
| 2004/0127637 | A1 | 7/2004 | Hsu et al. | |
| 2005/0184287 | A1 | 8/2005 | Herron et al. | |
| 2005/0205860 | A1 | 9/2005 | Hsu et al. | |
| 2005/0222333 | A1* | 10/2005 | Hsu | 525/178 |
| 2005/0233165 | A1 | 10/2005 | Ido et al. | |
| 2006/0033421 | A1* | 2/2006 | Matsuura et al. | 313/499 |
| 2006/0043859 | A1 | 3/2006 | Fukuoka et al. | |
| 2006/0182994 | A1* | 8/2006 | Sakamoto et al. | 428/690 |

FOREIGN PATENT DOCUMENTS

| WO | WO 00/53565 A1 | 9/2000 |
|---|---|---|
| WO | WO 00/70655 A2 | 11/2000 |
| WO | WO 01/41512 A1 | 6/2001 |
| WO | WO 03/008424 A1 | 1/2003 |
| WO | WO 03/040257 A1 | 5/2003 |
| WO | WO 03/063555 A1 | 7/2003 |
| WO | WO 03/091688 A2 | 11/2003 |
| WO | WO 2004/016710 A1 | 2/2004 |
| WO | WO 2005/052027 A1 | 6/2005 |
| WO | WO 2006/043087 | * 4/2006 |

OTHER PUBLICATIONS

CRC Handbook of Chemistry and Physics, 81st Edition, 2000-2001 (Book not Included).

Y. Wang, Photoconductive Polymers, Kirk-Othmer Encyclopedia of Chemical Technology, Fourth Edition, 1996, vol. 18:837-860.
Yamamoto, Electrically Conducting and Thermally Stable N-Conjugated Poly (Arylene)s Prepared by Organometallic Processes, Progress in Polymer Science, 1992, vol. 17:1153-1205.
Colon et al., Journal of Polymer Science, Part A, Polymer Chemistry Edition, 1990, vol. 28:367-383.
Gustafsson et al., Flexible Light-Emitting Diodes Made From Soluble Conducting Polymers, Nature, 1992, vol. 357:477-479.
Kodomari et al., Selective Halogenation of Aromatic Hydrocarbons With Alumina-Supported Copper (II) Halides, J. Org. Chem., 1988, vol. 53:2093-2094.
PCT Partial International Search Report and Invitation to Pay Additional Fees for International Application No. PCT/US2007/023761.
Summons to Oral Proceedings before the European Patent Office for Application No. EP 07867418.1, counterpart to U.S. Appl. No. 11/939,015; Jun. 17, 2011.
Reply to Summons to Oral Proceedings for Application No. EP 07867418.1, counterpart to U.S. Appl. No. 11/939,015; Oct. 3, 2011.
Main Request—Claims (Annex to Reply to Summons to Oral Proceedings) Oct. 3, 2011.
1st Auxiliary Request—Claims (Annex to Reply to Summons to Oral Proceedings) Oct. 3, 2011.
2nd Auxiliary Request—Claims (Annex to Reply to Summons to Oral Proceedings) Oct. 3, 2011.
Internet Citation: 'Absorbance', [Online] 29 Sep. 2011, XP055010979 Retrieved from the Internet: [retrieved on Nov. 2, 2011].
Decision in Case No. T0142/06-3.3.03; Application No. 97909613.8; Publication No. 0982325; Polyvinylidene Chloride Latex and process for preparation thereof; EPO; Mar. 11, 2008 (Annex to Reply to Summons to Oral Proceedings).
Decision to Refuse Patent for Application No. EP 07867418.1, counterpart to U.S. Appl. No. 11/939,015; European Patent Office; Jan. 19, 2012.
Minutes of Oral Proceedings for Application No. EP 07867418.1, counterpart to U.S. App. No. 11/939,015; European Patent Office; Jan. 19, 2012.
Grounds for Appeal from Decision to Refuse Patent for Application No. EP 07867418.1, counterpart to U.S. Appl. No. 11/939,015; Apr. 23, 2012.
Definition of Cuvette; Wikipedia (E1 : Grounds for Appeal) Apr. 23, 2012.
Glass and Quartz Cuvettes from Nova Biotech (E2: Grounds for Appeal) Apr. 23, 2012.
Indication of Standard-sized Cuvettes available from Cole-Parmer (E3: Grounds for Appeal) Apr. 23, 2012.
Details of a Cuvette Holder available from Comecta (E4: Grounds for Appeal) Apr. 23, 2012.
Details of Model CV-1 Cuvette Module available from C&L Instruments, Inc. (E5: Grounds for Appeal) Apr. 23, 2012.

(Continued)

*Primary Examiner* — Jennifer Chriss
*Assistant Examiner* — Gregory Clark

(57) ABSTRACT

There is provided an active layer containing a dopant material and a host material, wherein the host material has an HPLC purity of at least 99.9% and an impurity absorbance no greater than 0.01. There is also provided an electronic device containing the active layer.

22 Claims, 1 Drawing Sheet

OTHER PUBLICATIONS

Details of the Peltier-based temperature-controlled Cuvette Holder available from Quantum Northwest (E6: Grounds for Appeal) Apr. 23, 2012.

Details of various Cuvettes for Spectrophotometry available from Jenway (E7: Grounds for Appeal) Apr. 23, 2012.

Declaration of Raymond Richardson (E8: Grounds for Appeal) Apr. 23, 2012.

Main Request—Claims (Annex to Grounds for Appeal) Apr. 23, 2012.

1st Auxiliary Request—Claims (Annex to Grounds for Appeal) Apr. 23, 2012.

2nd Auxiliary Request—Claims (Annex to Grounds for Appeal) Apr. 23, 2012.

3rd Auxiliary Request—Claims (Annex to Grounds for Appeal) Apr. 23, 2012.

4th Auxiliary Request—Claims (Annex to Grounds for Appeal) Apr. 23, 2012.

5th Auxiliary Request—Claims (Annex to Grounds for Appeal) Apr. 23, 2012.

* cited by examiner

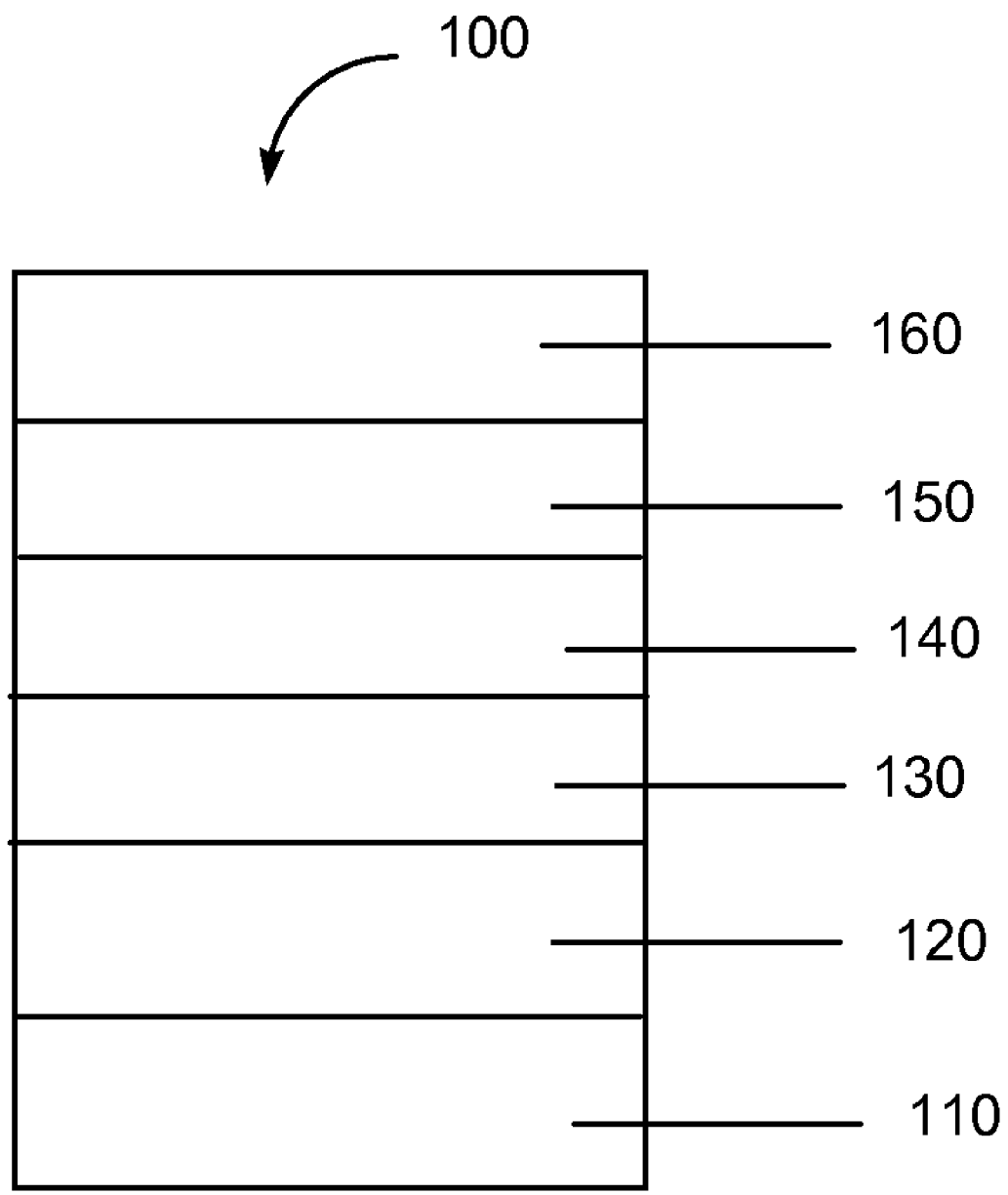

US 8,372,525 B2

ORGANIC ELECTRONIC DEVICE

BACKGROUND INFORMATION

1. Field of the Disclosure

This disclosure relates in general to photoactive layers for use in organic electronic devices. In particular, it relates to photoactive layers which are formed by solution processing.

2. Description of the Related Art

In organic electronic devices, such as organic light emitting diodes ("OLED"), that make up OLED displays, an organic active layer is sandwiched between two electrical contact layers in an OLED display. In an OLED the organic active layer is a photoactive layer which emits light through the light-transmitting electrical contact layer upon application of a voltage across the electrical contact layers.

It is well known to use organic electroluminescent compounds as the photoactive component in light-emitting diodes. Simple organic molecules, conjugated polymers, and organometallic complexes have been used. Devices that use photoactive materials frequently include one or more charge transport layers, which are positioned between a photoactive (e.g., light-emitting) layer and a contact layer (hole-injecting contact layer). A device can contain two or more contact layers. A hole transport layer can be positioned between the photoactive layer and the hole-injecting contact layer. The hole-injecting contact layer may also be called the anode. An electron transport layer can be positioned between the photoactive layer and the electron-injecting contact layer. The electron-injecting contact layer may also be called the cathode.

There is a continuing need for electronic devices having improved performance, and in particular, improved lifetime.

SUMMARY

There is provided an active layer comprising a dopant material and a host material, wherein said host material has an HPLC purity of at least 99.9% and an impurity absorbance no greater than 0.01.

There is also provided an electronic device comprising the above active layer and a hole transport layer.

There is also provided an electronic device comprising the above active layer, a hole transport layer, and a buffer layer comprising a conductive polymer and a fluorinated acid polymer.

There is also provided an organic electronic device comprising an anode and a cathode and having organic layers there between, wherein the organic layers are, in order:

a buffer layer comprising a conductive polymer and a fluorinated acid polymer;

a hole transport layer;

a photoactive layer comprising a dopant material and a host material, wherein said host material has an HPLC purity of at least 99.9% and an impurity absorbance no greater than 0.01; and an electron transport layer.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

FIG. 1 includes as illustration of one example of an organic electronic device.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

There is provided an active layer comprising a dopant material and a host material, wherein said host material has an HPLC purity of at least 99.9% and an impurity absorbance purity no greater than 0.01.

There is also provided an electronic device comprising the above active layer and a hole transport layer.

There is also provided an electronic device comprising the above active layer, a hole transport layer, and a buffer layer comprising a conductive polymer and a fluorinated acid polymer.

There is also provided an organic electronic device comprising an anode and a cathode and having organic layers there between, wherein the organic layers are, in order:

a buffer layer comprising a conductive polymer and a fluorinated acid polymer;

a hole transport layer;

a photoactive layer comprising a dopant material and a host material, wherein said host material has an HPLC purity of at least 99.9% and an impurity absorbance no greater than 0.01; and an electron transport layer.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Device Structure, the Photoactive Layer, the Hole Transport Layer, the Buffer Layer, Other Device Layers, Device Fabrication, and finally Examples.

1. Definitions and Clarification of Terms

Before addressing details of embodiments described below, some terms are defined or clarified.

The term "HPLC purity" as it relates to a material, is intended to mean the relative absorbance ratio of the specified material peak to all other peaks integrated over the wavelength range of 210-500 nm, as measured by high performance liquid chromatography.

The term "impurity absorbance" is intended to mean the maximum absorbance (in absorbance units) of an at least 2% (wt/vol) solution of the material in THF in the range of 450-1000 nm.

The term "light impurity" is intended to mean an impurity having a lower molecular weight and/or higher volatility than the desired compound.

The term "heavy impurity" is intended to mean an impurity having a higher molecular weight and/or lower volatility than the desired compound.

The term "dopant material" is intended to mean a material, within a layer including a host material, that changes the electronic characteristic(s) or the targeted wavelength(s) of radiation emission, reception, or filtering of the layer compared to the electronic characteristic(s) or the wavelength(s) of radiation emission, reception, or filtering of the layer in the absence of such material.

The term "host material" is intended to mean a material, usually in the form of a layer, to which a dopant material may be added. The host material may or may not have electronic characteristic(s) or the ability to emit, receive, or filter radiation. The dopant material may be added to the host material prior to or subsequent to formation of the layer. In one embodiment, the host material comprises greater than 50% by weight of the layer.

The term "aromatic" as it applied to a compound or group, is intended to mean an organic compound or group comprising at least one unsaturated cyclic group having delocalized pi electrons. The term is intended to encompass both aromatic compounds and groups having only carbon and hydrogen atoms, and heteroaromatic compounds and groups wherein one or more of the carbon atoms within the cyclic group has been replaced by another atom, such as nitrogen, oxygen, sulfur, or the like.

The term "buffer layer" or "buffer material" is intended to mean electrically conductive or semiconductive materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Buffer materials may be polymers, oligomers, or small molecules, and may be in the form of solutions, dispersions, suspensions, emulsions, colloidal mixtures, or other compositions.

The term "charge transport," when referring to a layer, material, member, or structure is intended to mean such layer, material, member, or structure facilitates migration of such charge through the thickness of such layer, material, member, or structure with relative efficiency and small loss of charge. "Hole transport" refers to positive charges. "Electron transport" refers to negative charges.

The term "group" is intended to mean a part of a compound, such as a substituent in an organic compound or a ligand in a metal complex. The prefix "hetero" indicates that one or more carbon atoms have been replaced with a different atom. The prefix "fluoro" indicates that one or more hydrogen atoms have been replaced with a fluorine atom. Examples of substituents include, but are not limited to, alkyl, alkenyl, alkynyl, alkoxy, oxyalkyl, oxyalkenyl, oxyalkynyl, fluorinated alkyl, fluorinated alkenyl, fluorinated oxyalkyl, fluorinated oxyalkenyl, fluorinated oxyalkynyl, aryl, heteroalkyl, heteroalkenyl, heteroalkynyl, heteroaryl, —CN, —OR, —CO$_2$R, —SR, —N(R)$_2$, —P(R)$_2$, —SOR, —SO$_2$R, and —NO$_2$; or adjacent groups together can form a 5- or 6-membered cycloalkyl, aryl, or heteroaryl ring, where R is selected from alkyl and aryl.

The term "liquid deposition" refers to the formation of a layer from a liquid material, and includes both continuous and discontinuous deposition techniques. Continuous liquid deposition techniques, include but are not limited to, spin coating, gravure coating, curtain coating, dip coating, slot-die coating, spray coating, and continuous nozzle coating. Discontinuous liquid deposition techniques include, but are not limited to, ink jet printing, gravure printing, and screen printing.

The term "liquid" is intended to include single liquid materials, combinations of liquid materials, and the liquid materials may be in the form of solutions, dispersions, suspensions and emulsions.

The term "layer" is used interchangeably with the term "film" and refers to a coating covering a desired area. The term is not limited by size. The area can be as large as an entire device or as small as a specific functional area such as the actual visual display, or as small as a single sub-pixel.

The term "photoactive" refers to a material that emits light when activated by an applied voltage (such as in a light-emitting diode or light-emitting electrochemical cell), or responds to radiant energy and generates a signal with or without an applied bias voltage (such as in a photodetector). In one embodiment, a photoactive layer is an emitter layer.

The term "polymer" is intended to mean a material having at least one repeating monomeric unit. The term includes homopolymers having only one kind of monomeric unit, and copolymers having two or more different monomeric units. Copolymers are a subset of polymers. In some embodiments, a polymer has at least 5 repeating units.

The term "small molecule," when referring to a compound, is intended to mean a compound which does not have repeating monomeric units. In some embodiments, a small molecule has a molecular weight no greater than approximately 2000 g/mol.

The term "electrically conductive polymer" is intended to mean any polymer or oligomer which is inherently or intrinsically capable of electrical conductivity without the addition of carbon black or conductive metal particles. The conductivity of a conductive polymer composition is measured as the lateral conductivity of films made from the composition, in S/cm.

The term "fluorinated acid polymer" is intended to mean a polymer having acidic groups, where at least some of the hydrogens have been replaced by fluorine. The term "acidic group" refers to a group capable of ionizing to donate a hydrogen ion to a Brønsted base.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Device Structure

Organic electronic devices that may benefit from having one or more photoactive layers as described herein include, but are not limited to, (1) devices that convert electrical energy into radiation (e.g., a light-emitting diode, light emitting diode display, or diode laser), (2) devices that detect signals through electronics processes (e.g., photodetectors, photoconductive cells, photoresistors, photoswitches, phototransistors, phototubes, IR detectors), (3) devices that convert radiation into electrical energy, (e.g., a photovoltaic device or solar cell), and (4) devices that include one or more electronic components that include one or more organic semiconductor layers (e.g., a transistor or diode).

One illustration of an organic electronic device structure is shown in FIG. 1. The device 100 has an anode layer 110 and a cathode layer 160, and a photoactive layer 140 between them. Adjacent to the anode is a buffer layer 120. Adjacent to the buffer layer is a hole transport layer 130, comprising hole transport material. Adjacent to the cathode may be an electron transport layer 150, comprising an electron transport material. As an option, devices may use one or more additional hole injection or hole transport layers (not shown) next to the anode 110 and/or one or more additional electron injection or electron transport layers (not shown) next to the cathode 160.

In one embodiment, the different layers have the following range of thicknesses: anode 110, 500-5000 Å, in one embodiment 1000-2000 Å; buffer layer 120, 50-2000 Å, in one embodiment 200-1000 Å; hole transport layer 120, 50-2000 Å, in one embodiment 200-1000 Å; photoactive layer 130, 10-2000 Å, in one embodiment 100-1000 Å; layer 140, 50-2000 Å, in one embodiment 100-1000 Å; cathode 150, 200-10000 Å, in one embodiment 300-5000 Å. The location of the electron-hole recombination zone in the device, and thus the emission spectrum of the device, can be affected by the relative thickness of each layer. The desired ratio of layer thicknesses will depend on the exact nature of the materials used.

3. Photoactive Layer

The photoactive layer comprises a photoactive dopant material and a host material, wherein the host material has an HPLC purity of at least 99.9% and an impurity absorbance no greater than 0.01. In some embodiments, the host material has an HPLC purity of at least 99.98%. In some embodiments, the dopant material has an HPLC purity of at least 99%. In some embodiments, the dopant material has an HPLC purity of at least 99.5%. In some embodiments, both the dopant and host materials are small molecule materials.

Surprisingly and unexpectedly, it has been found that photoactive layers having materials of such high purity have improved performance. In some embodiments, electronic devices made with such photoactive layers have improved lifetimes.

Purification of the materials can be accomplished using any known purification technique. These include, but are not limited to, solution purification techniques, such as recrystallization and column chromatography, and vapor sublimation techniques such as batch vapor distillation, train sublimation, ampoule vapor recrystallization, and zone refining. In some embodiments, more than one technique is used. In some embodiments, a combination of solution purification and vapor sublimation is used.

Solution purification can be carried out using any solvent in which the material has sufficient solubility. In some embodiments, solvents such as chloroform, THF, hexanes, and lower alcohols can be used. Similar solvents can be used for column chromatography, with silica gel or alumina adsorbents.

Batch vapor distillation ("BVD") involves loading a material into a vacuum system, pumping to less than $2\times10^{-6}$ T, and heating the bulk material to drive off light impurities. When light impurities have been driven off the sublimed product material is collected separately from the lights. Heavy impurities are left behind in the sublimation crucible. Train sublimation involves loading a material into a horizontal or vertical vacuum column upon which a temperature gradient has been applied. The applied vacuum is less than $2\times10^{-6}$ T. The source end of the column is heated above the sublimation point of the desired product material. Light impurities are sublimed further down the column temperature gradient than the desired product, heavy impurities are left behind in the source zone or are upstream of the desired product.

Additional purification techniques such as ampoule vapor recrystallization and zone refining are necessary for some organic semiconductors that melt to a low viscosity liquid state before significant sublimation occurs, or have a strong tendency to crystallize in the solid state. Ampoule vapor recrystallization involves sealing a quantity of material under high vacuum in a glass or quartz vacuum ampoule and then repeatedly heating the ampoule and letting it slowly cool to induce recrystallization. Melted or sublimed material is then able to recrystallize as single crystals leaving out impurities. Zone refining is similar to vapor recrystallization, but does sublime the semiconductor but rather melts it in bulk. Impurities are driven to the edge of the bulk material by differential solubility at the solid liquid interface. Repeated melting and solidification drives impurities to the outside of the semiconductor mass where they can be easily removed.

a. Photoactive Dopant Materials

In some embodiments, the photoactive dopant materials are electroluminescent and are selected from materials which have red, green and blue emission colors. Electroluminescent materials include small molecule organic fluorescent compounds, fluorescent and phosphorescent metal complexes, conjugated polymers, and mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (AlQ); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly (phenylenevinylenes), polyfluorenes, poly(spirobifluorenes), polythiophenes, poly(p-phenylenes), copolymers thereof, and mixtures thereof.

In some embodiments, the EL material is a cyclometalated complex of iridium. In some embodiments, the complex has two ligands selected from phenylpyridines, phenylquinolines, and phenylisoquinolines, and a third liqand with is a β-dienolate. The ligands may be unsubstituted or substituted with F, D, alkyl, CN, or aryl groups.

In some embodiments, the EL material is a polymer selected from the group consisting of poly(phenylenevinylenes), polyfluorenes, and polyspirobifluorenes.

In some embodiments, the EL material is selected from the group consisting of a non-polymeric spirobifluorene compound and a fluoranthene compound.

In some embodiments, the EL material is a compound having aryl amine groups. In some embodiments, the EL material is selected from the formulae below:

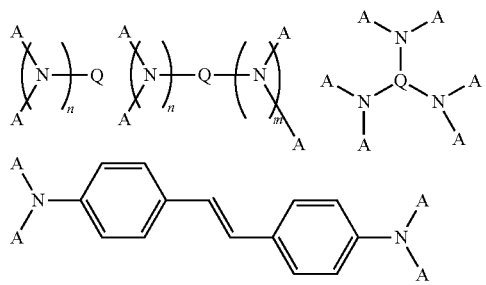

where:
A is the same or different at each occurrence and is an aromatic group having from 3-60 carbon atoms;
Q is a single bond or an aromatic group having from 3-60 carbon atoms;
n and m are independently an integer from 1-6.

In some embodiments of the above formula, at least one of A and Q in each formula has at least three condensed rings. In some embodiments, m and n are equal to 1.

In some embodiments, Q is a styryl or styrylphenyl group.

In some embodiments, Q is an aromatic group having at least two condensed rings. In some embodiments, Q is selected from the group consisting of naphthalene, anthracene, chrysene, pyrene, tetracene, xanthene, perylene, coumarin, rhodamine, quinacridone, and rubrene.

In some embodiments, A is selected from the group consisting of phenyl, tolyl, naphthyl, and anthracenyl groups.

In some embodiments, the EL material has the formula below:

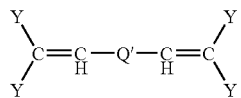

where:
Y is the same or different at each occurrence and is an aromatic group having 3-60 carbon atoms;
Q' is an aromatic group, a divalent triphenylamine residue group, or a single bond.

In some embodiments, the EL material is an aryl acene. In some embodiments, the EL material is a non-symmetrical aryl acene.

In some embodiments, the EL material is a chrysene derivative. The term "chrysene" is intended to mean 1,2-benzophenanthrene. In some embodiments, the EL material is a chrysene having aryl substituents. In some embodiments, the EL material is a chrysene having arylamino substituents. In some embodiments, the EL material is a chrysene having two different arylamino substituents. In some embodiments, the chrysene derivative has a deep blue emission.

In some embodiments, the EL material is selected from the group consisting of E1 through E6 below:

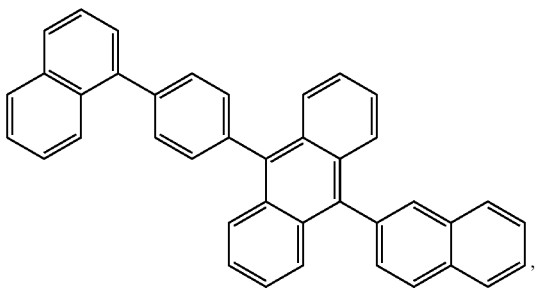

E1

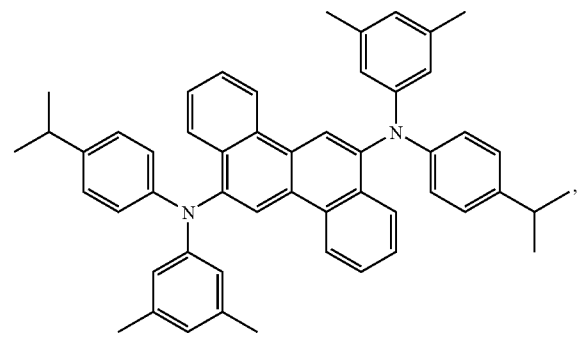

E2

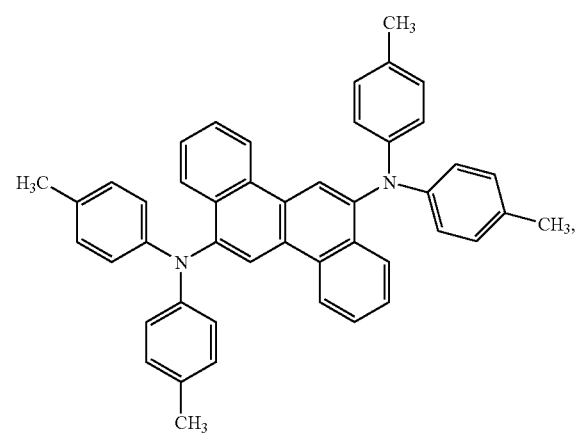

E3

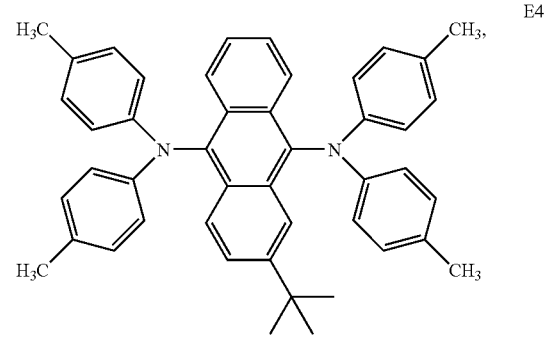

E4

In some embodiments, the host has the formula:

where:
A¹ and A² are the same or different at each occurrence and are selected from the group consisting of H, an aromatic group, and an alkenyl group, or A may represent one or more fused aromatic rings;
p and q are the same or different and are an integer from 1-3. In some embodiments, the anthracene derivative is non-symmetrical. In some embodiments, p=2 and q=1. In some embodiments, at least one of A¹ and A² is a naphthyl group.

In some embodiments, the host is selected from the group consisting of and combinations thereof.

In some embodiments, the host can be used in combination with another host as the emitter in a photoactive layer.

In some embodiments, the HPLC purity is at least 99.99% and the impurity absorbance is less than 0.005.

4. Hole Transport Layer

Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting small molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 4,4'-bis(carbazol-9-yl)biphenyl (CBP); 1,3-bis(carbazol-9-yl)benzene (mCP); 1,1-bis[(di-4-tolylamino) phenyl]cyclohexane (TAPC); N,N'-bis(4-methylphenyl)-N,N'-bis(4-ethylphenyl)-[1,1'-(3, b. Host Materials

In some embodiments, the host is a bis-condensed cyclic aromatic compound

In some embodiments, the host is an anthracene derivative compound. In some embodiments the compound has the formula:

An-L-An where:
An is an anthracene moiety;
L is a divalent connecting group.

In some embodiments of this formula, L is a single bond, —O—, —S—, —N(R)—, or an aromatic group. In some embodiments, An is a mono- or diphenylanthryl moiety.

In some embodiments, the host has the formula:

A-An-A where:
An is an anthracene moiety;
A is an aromatic group.

In some embodiments, the host is a diarylanthracene. In some embodiments the compound is symmetrical and in some embodiments the compound is non-symmetrical.

3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl] (4-methylphenyl)methane (MPMP); 1-phenyl-3-[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis (naphthalen-1-yl)-N,N'-bis-(phenyl)benzidine (α-NPB); and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate.

In some embodiments, the hole transport layer comprises a hole transport polymer. In some embodiments, the hole transport polymer is a distyrylaryl compound. In some embodiments, the aryl group is has two or more fused aromatic rings. In some embodiments, the aryl group is an acene. The term "acene" as used herein refers to a hydrocarbon parent component that contains two or more ortho-fused benzene rings in a straight linear arrangement.

In some embodiments, the hole transport polymer is an arylamine polymer. In some embodiments, it is a copolymer of fluorene and arylamine monomers.

In some embodiments, the polymer has crosslinkable groups. In some embodiments, crosslinking can be accomplished by a heat treatment and/or exposure to UV or visible radiation. Examples of crosslinkable groups include, but are not limited to vinyl, acrylate, perfluorovinylether, 1-benzo-3,4-cyclobutane, siloxane, and methyl esters. Crosslinkable polymers can have advantages in the fabrication of solution-process OLEDs. The application of a soluble polymeric material to form a layer which can be converted into an insoluble film subsequent to deposition, can allow for the fabrication of multilayer solution-processed OLED devices free of layer dissolution problems.

Examples of crosslinkable polymers can be found in, for example, published US patent application 2005-0184287 and published PCT application WO 2005/052027.

In some embodiments, the hole transport layer comprises a polymer which is a copolymer of 9,9-dialkylfluorene and triphenylamine. In some embodiments, the polymer is a copolymer of 9,9-dialkylfluorene and 4,4'-bis(diphenylamino)biphenyl. In some embodiments, the polymer is a copolymer of 9,9-dialkylfluorene and TPB. In some embodiments, the polymer is a copolymer of 9,9-dialkylfluorene and NPB. In some embodiments, the copolymer is made from a third comonomer selected from (vinylphenyl)diphenylamine and 9,9-distyrylfluorene or 9,9-di(vinylbenzyl)fluorene.

In some embodiments, the hole transport layer comprises a polymer having Formula I:

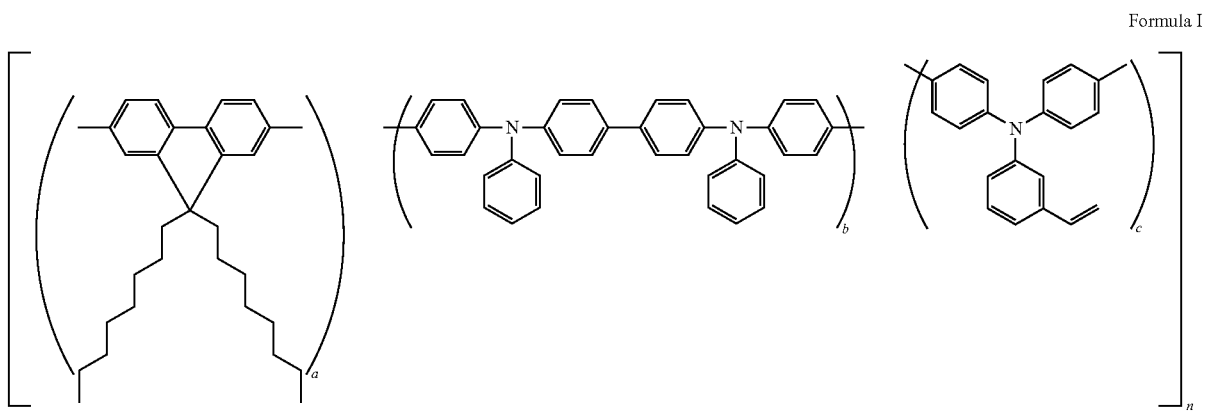

Formula I where a, b, and c represent the relative proportion of monomers in the polymer and are non-zero integers; n is a non-zero integer of at least 2. In some embodiments, a, b, and c have values in the range of 1-10. In some embodiments, the ratio a:b:c has the ranges (1-4):(1-4):(1-2). In some embodiments, n is 2-500.

In some embodiments, the hole transport layer comprises a polymer having Formula II:

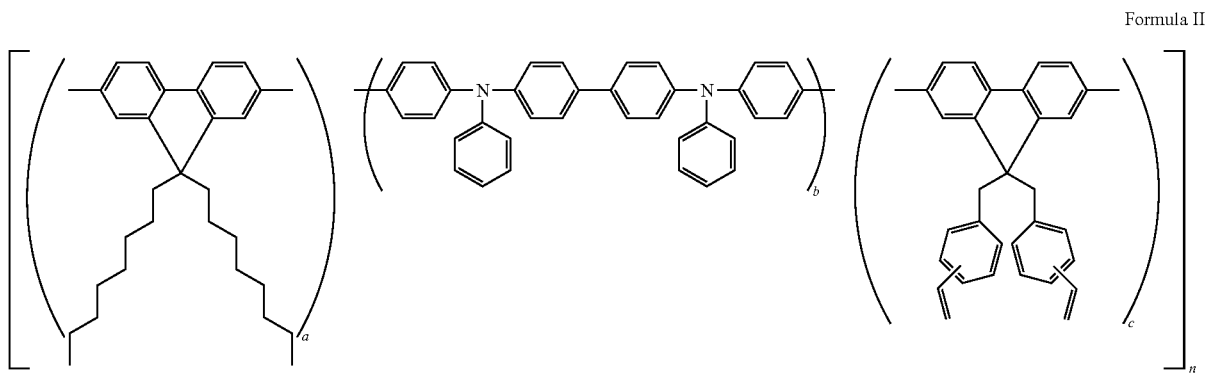

Formula II where a, b, and c represent the relative proportion of monomers in the polymer and are non-zero integers; n is a non-zero integer of at least 2. In some embodiments, a, b, and c have values in the range of 0.001-10. In some embodiments, the ratio a:b:c has the ranges (2-7):(2-7):(1-3). In some embodiments, n is 2-500.

The polymers for the hole transport layer, in particular, polymers having Formula I or Formula II, can generally be prepared by three known synthetic routes. In a first synthetic method, as described in Yamamoto, Progress in Polymer Science, Vol. 17, p 1153 (1992), the dihalo or ditriflate derivatives of the monomeric units are reacted with a stoichiometric amount of a zerovalent nickel compound, such as bis(1,5-cyclooctadiene)nickel(0). In the second method, as described in Colon et al., Journal of Polymer Science, Part A, Polymer chemistry Edition, Vol. 28, p. 367 (1990). The dihalo or ditriflate derivatives of the monomeric units are reacted with catalytic amounts of Ni(II) compounds in the presence of stoichiometric amounts of a material capable of reducing the divalent nickel ion to zerovalent nickel. Suitable materials include zinc, magnesium, calcium and lithium. In the third synthetic method, as described in U.S. Pat. No. 5,962,631, and published PCT application WO 00/53565, a dihalo or ditriflate derivative of one monomeric unit is reacted with a derivative of another monomeric unit having two reactive groups selected from boronic acid, boronic acid esters, and boranes, in the presence of a zerovalent or divalent palladium catalyst, such as tetrakis(triphenylphosphine)Pd or Pd(OAc)$_2$.

In some embodiments, the hole transport layer comprises a polymer selected from the group consisting of P1 through P11:

P1:

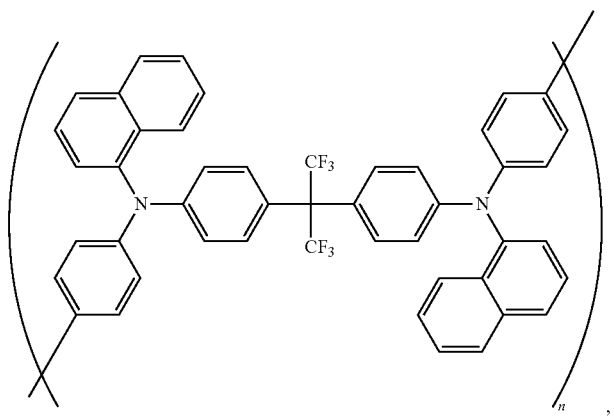

$C_{49}H_{36}F_6N_2$
Exact Mass: 766.28
Mol. Wt.: 766.81

-continued
P2:
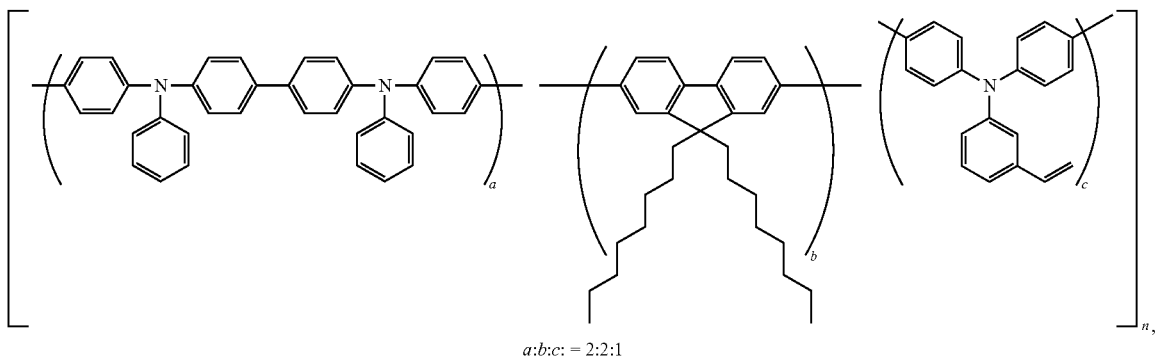
a:b:c: = 2:2:1
P3:
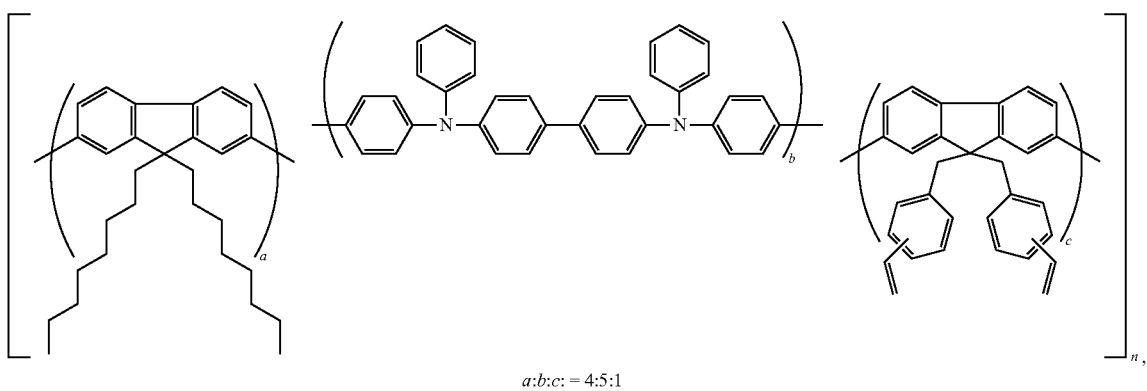
a:b:c: = 4:5:1
P4:
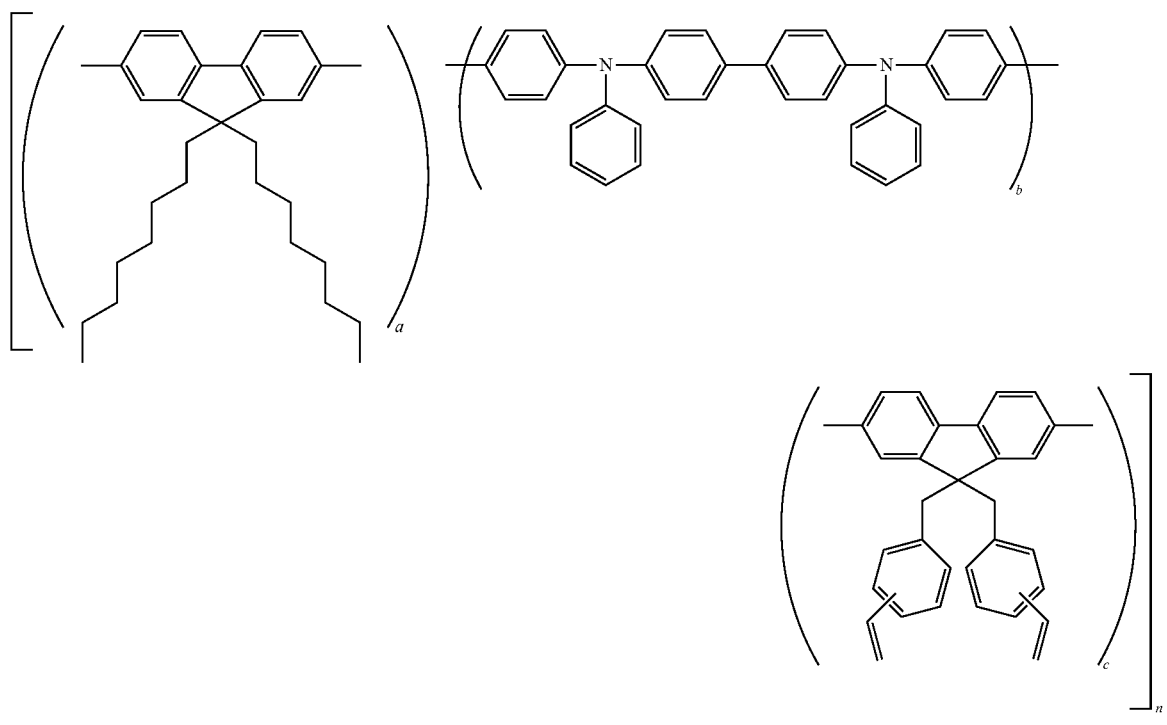
a:b:c: = 3:5:2

-continued
P5:
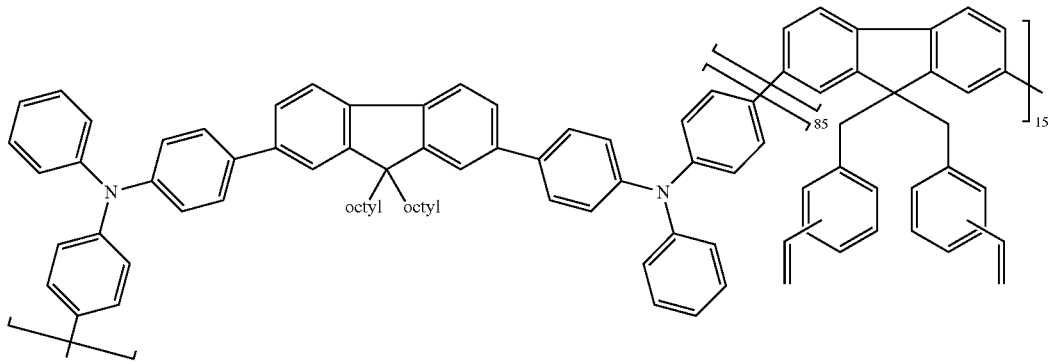
P6:
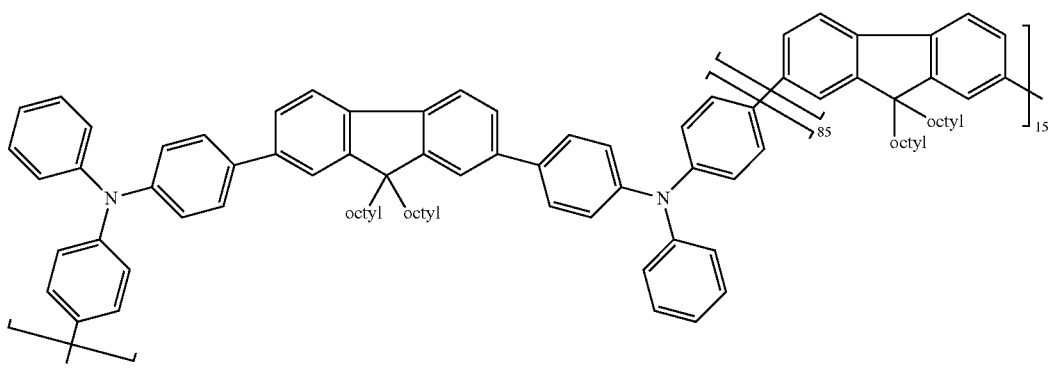
P7:
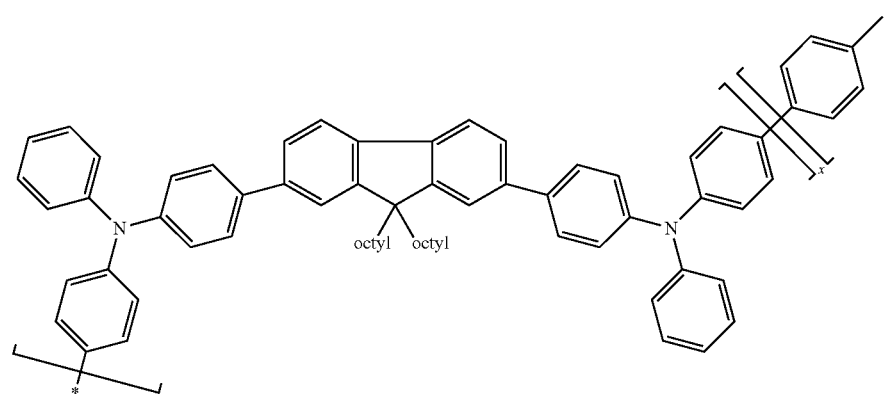

-continued
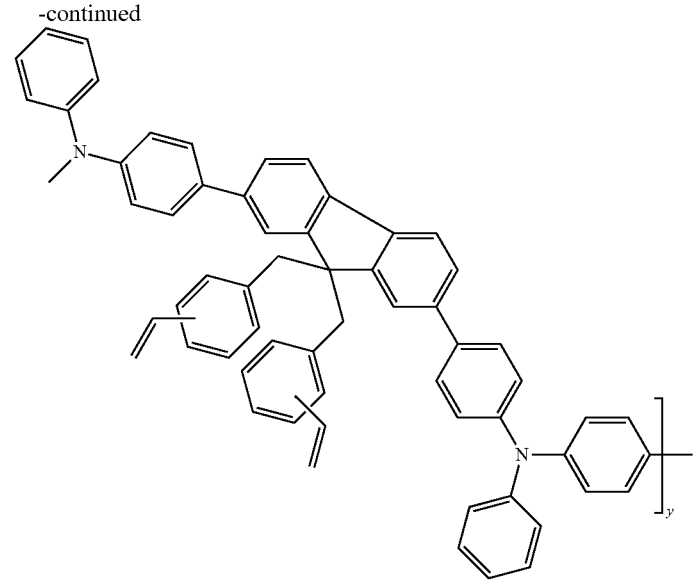
P8:
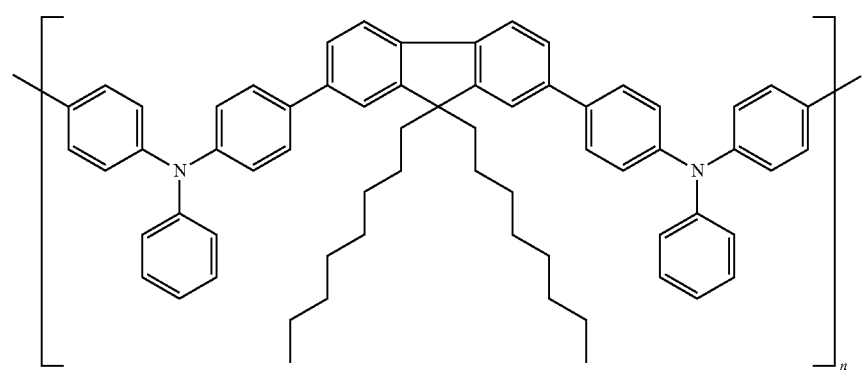
P9:
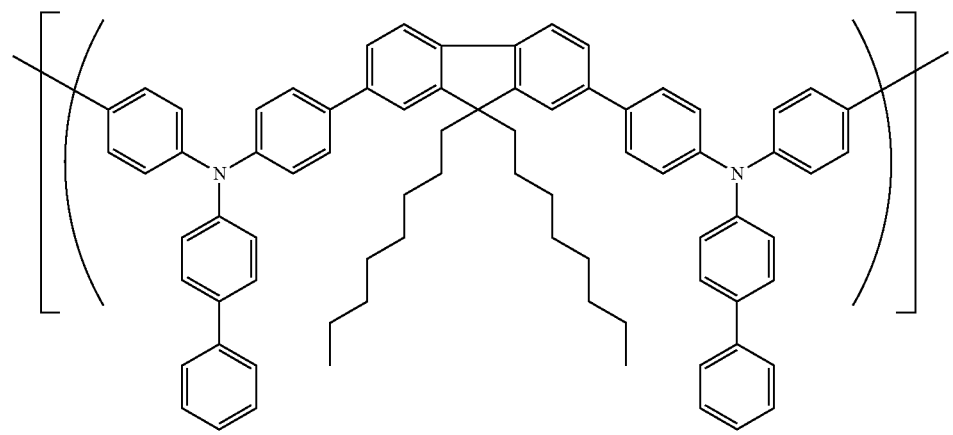

P10:
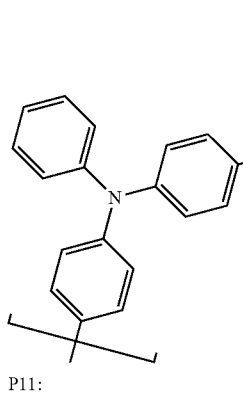
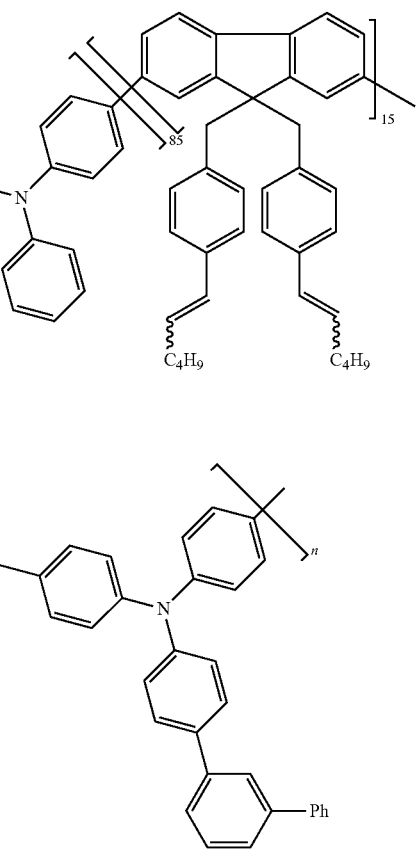

P11:
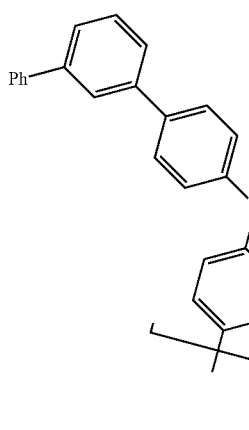

In some embodiments, the hole transport layer comprises a polymer selected from the group consisting of P2 through P5 and P7 which has been crosslinked subsequent to the formation of the layer.

In some embodiments, the hole transport layer comprises a polymer selected from the group consisting of P1 and P6, P8, P9, or P11, which, has been heated subsequent to the formation of the layer.

5. Buffer Layer

The buffer layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like.

The buffer layer can comprise charge transfer compounds, and the like, such as copper phthalocyanine and the tetrathiafulvalene-tetracyanoquinodimethane system (TTF-TCNQ).

In some embodiments, the buffer layer comprises at least one electrically conductive polymer and at least one fluorinated acid polymer.

In some embodiments, the electrically conductive polymer will form a film which has a conductivity of at least $10^{-7}$ S/cm. The monomer from which the conductive polymer is formed, is referred to as a "precursor monomer". A copolymer will have more than one precursor monomer. In some embodiments, the conductive polymer is made from at least one precursor monomer selected from thiophenes, selenophenes, tellurophenes, pyrroles, anilines, and polycyclic aromatics. The polymers made from these monomers are referred to herein as polythiophenes, poly(selenophenes), poly(tellurophenes), polypyrroles, polyanilines, and polycyclic aromatic polymers, respectively. The term "polycyclic aromatic" refers to compounds having more than one aromatic ring. The rings may be joined by one or more bonds, or they may be fused together. The term "aromatic ring" is intended to include heteroaromatic rings. A "polycyclic heteroaromatic" compound has at least one heteroaromatic ring. In some embodiments, the polycyclic aromatic polymers are poly(thienothiophenes).

The fluorinated acid polymer can be any polymer which is fluorinated and has acidic groups with acidic protons. The term includes partially and fully fluorinated materials. In some embodiments, the fluorinated acid polymer is highly fluorinated. The term "highly fluorinated" means that at least 50% of the available hydrogens bonded to a carbon, have been replaced with fluorine. The acidic groups supply an ionizable proton. In some embodiments, the acidic proton has a pKa of less than 3. In some embodiments, the acidic proton has a pKa of less than 0. In some embodiments, the acidic proton has a pKa of less than −5. The acidic group can be attached directly to the polymer backbone, or it can be attached to side chains on the polymer backbone. Examples of acidic groups include, but are not limited to, carboxylic acid groups, sulfonic acid groups, sulfonimide groups, phosphoric acid groups, phosphonic acid groups, and combinations thereof. The acidic groups can all be the same, or the polymer may have more than one type of acidic group.

In some embodiments the fluorinated acid polymer is water-soluble. In some embodiments, the fluorinated acid polymer is dispersible in water. In some embodiments, the fluorinated acid polymer is organic solvent wettable.

In some embodiments, fluorinated acid polymer has a polymer backbone which is fluorinated. Examples of suitable polymeric backbones include, but are not limited to, polyolefins, polyacrylates, polymethacrylates, polyimides, polyamides, polyaramids, polyacrylamides, polystyrenes, and copolymers thereof. In some embodiments, the polymer backbone is highly fluorinated. In some embodiments, the polymer backbone is fully fluorinated.

In some embodiments, the acidic groups are sulfonic acid groups or sulfonimide groups. A sulfonimide group has the formula:

where R is an alkyl group.

In some embodiments, the acidic groups are on a fluorinated side chain. In some embodiments, the fluorinated side chains are selected from alkyl groups, alkoxy groups, amido groups, ether groups, and combinations thereof.

In some embodiments, the fluorinated acid polymer has a fluorinated olefin backbone, with pendant fluorinated ether sulfonate, fluorinated ester sulfonate, or fluorinated ether sulfonimide groups. In some embodiments, the polymer is a copolymer of 1,1-difluoroethylene and 2-(1,1-difluoro-2-(trifluoromethyl)allyloxy)-1,1,2,2-tetrafluoroethanesulfonic acid. In some embodiments, the polymer is a copolymer of ethylene and 2-(2-(1,2,2-trifluorovinyloxy)-1,1,2,3,3,3-hexafluoropropoxy)-1,1,2,2-tetrafluoroethanesulfonic acid. These copolymers can be made as the corresponding sulfonyl fluoride polymer and then can be converted to the sulfonic acid form.

In some embodiments, the fluorinated acid polymer is homopolymer or copolymer of a fluorinated and partially sulfonated poly(arylene ether sulfone). The copolymer can be a block copolymer. Examples of comonomers include, but are not limited to butadiene, butylene, isobutylene, styrene, and combinations thereof.

In some embodiments, the buffer layer is made from an aqueous dispersion of an electrically conducting polymer and a colloid-forming polymeric acid. Such materials have been described in, for example, published U.S. patent applications 2004-0102577, 2004-0127637, and 2005-0205860.

6. Other Device Layers

The other layers in the device can be made of any materials which are known to be useful in such layers. The anode is an electrode that is particularly efficient for injecting positive charge carriers. It can be made of, for example materials containing a metal, mixed metal, alloy, metal oxide or mixed-metal oxide, or it can be a conducting polymer, and mixtures thereof. Suitable metals include the Group 11 metals, the metals in Groups 4, 5, and 6, and the Group 8-10 transition metals. If the anode is to be light-transmitting, mixed-metal oxides of Groups 12, 13 and 14 metals, such as indium-tin-oxide, are generally used. The anode may also comprise an organic material such as polyaniline as described in "Flexible light-emitting diodes made from soluble conducting polymer," Nature vol. 357, pp 477 479 (11 Jun. 1992). At least one of the anode and cathode should be at least partially transparent to allow the generated light to be observed.

Examples of electron transport materials which can be used in the optional electron transport layer 140, include metal chelated oxinoid compounds, such as tris(8-hydroxyquinolato)aluminum (AlQ), bis(2-methyl-8-quinolinolato) (p-phenylphenolato) aluminum (BAlq), and tetrakis-(8-hydroxyquinolato)zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); and mixtures thereof.

The cathode, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. Li-containing organometallic compounds, LiF, and Li$_2$O can also be deposited between the organic layer and the cathode layer to lower the operating voltage. This layer may be referred to as an electron injection layer.

7. Device Fabrication

In some embodiments, the device is fabricated by liquid deposition of the buffer layer, the hole transport layer, and the photoactive layer, and by vapor deposition of the anode, the electron transport layer, an electron injection layer and the cathode.

The buffer layer can be deposited from any liquid medium in which it is dissolved or dispersed and from which it will form a film. In one embodiment, the liquid medium consists essentially of one or more organic solvents. In one embodiment, the liquid medium consists essentially of water or water and an organic solvent. In one embodiment the organic solvent is selected from the group consisting of alcohols, ketones, cyclic ethers, and polyols. In one embodiment, the organic liquid is selected from dimethylacetamide ("DMAc"), N-methylpyrrolidone ("NMP"), dimethylformamide ("DMF"), ethylene glycol ("EG"), aliphatic alcohols, and mixtures thereof. The buffer material can be present in the liquid medium in an amount from 0.5 to 10 percent by weight. Other weight percentages of buffer material may be used depending upon the liquid medium. The buffer layer can be applied by any continuous or discontinuous liquid deposition technique. In one embodiment, the buffer layer is applied by spin coating. In one embodiment, the buffer layer is applied by ink jet printing. After liquid deposition, the liquid medium can be removed in air, in an inert atmosphere, or by vacuum, at room temperature or with heating. In one embodiment, the layer is heated to a temperature less than 275° C. In one embodiment, the heating temperature is between 100° C. and 275° C. In one embodiment, the heating temperature is between 100° C. and 120° C. In one embodiment, the heating temperature is between 120° C. and 140° C. In one embodiment, the heating temperature is between 140° C. and 160° C. In one embodiment, the heating temperature is between 160° C. and 180° C. In one embodiment, the heating temperature is between 180° C. and 200° C. In one embodiment, the heating temperature is between 200° C. and 220° C. In one embodiment, the heating temperature is between 190° C. and 220° C. In one embodiment, the heating temperature is between 220° C. and 240° C. In one embodiment, the heating temperature is between 240° C. and 260° C. In one embodiment, the heating temperature is between 260° C. and 275° C. The heating time is dependent upon the temperature, and is generally between 5 and 60 minutes. In one embodiment, the final layer thickness is between 5 and 200 nm. In one embodiment, the final layer thickness is between 5 and 40 nm. In one embodiment, the final layer thickness is between 40 and 80 nm. In one embodiment, the final layer thickness is between 80 and 120 nm. In one embodiment, the final layer thickness is between 120 and 160 nm. In one embodiment, the final layer thickness is between 160 and 200 nm.

The hole transport layer can be deposited from any liquid medium in which it is dissolved or dispersed and from which it will form a film. In one embodiment, the liquid medium consists essentially of one or more organic solvents. In one embodiment, the liquid medium consists essentially of water or water and an organic solvent. In one embodiment the organic solvent is an aromatic solvent. In one embodiment, the organic liquid is selected from chloroform, dichloromethane, toluene, xylene, mesitylene, anisole, and mixtures thereof. The hole transport material can be present in the liquid medium in a concentration of 0.2 to 2 percent by weight. Other weight percentages of hole transport material may be used depending upon the liquid medium. The hole transport layer can be applied by any continuous or discontinuous liquid deposition technique. In one embodiment, the hole transport layer is applied by spin coating. In one embodiment, the hole transport layer is applied by ink jet printing. After liquid deposition, the liquid medium can be removed in air, in an inert atmosphere, or by vacuum, at room temperature or with heating. In one embodiment, the layer is heated to a temperature of 300° C. or less. In one embodiment, the heating temperature is between 170° C. and 275° C. In one embodiment, the heating temperature is between 170° C. and 200° C. In one embodiment, the heating temperature is between 190° C. and 220° C. In one embodiment, the heating temperature is between 210° C. and 240° C. In one embodiment, the heating temperature is between 230° C. and 270° C. In one embodiment, the heating temperature is between 270° C. and 300° C. The heating time is dependent upon the temperature, and is generally between 5 and 60 minutes. In one embodiment, the final layer thickness is between 5 and 50 nm. In one embodiment, the final layer thickness is between 5 and 15 nm. In one embodiment, the final layer thickness is between 15 and 25 nm. In one embodiment, the final layer thickness is between 25 and 35 nm. In one embodiment, the final layer thickness is between 35 and 50 nm.

The photoactive layer can be deposited from any liquid medium in which it is dissolved or dispersed and from which it will form a film. In one embodiment, the liquid medium consists essentially of one or more organic solvents. In one embodiment, the liquid medium consists essentially of water or water and an organic solvent. In one embodiment the organic solvent is an aromatic solvent. In one embodiment, the organic solvent is selected from chloroform, dichloromethane, toluene, anisole, 2-butanone, 3-pentanone, butyl acetate, acetone, xylene, mesitylene, chlorobenzene, tetrahydrofuran, diethyl ether, trifluorotoluene, and mixtures thereof. The photoactive material can be present in the liquid medium in a concentration of 0.2 to 2 percent by weight. Other weight percentages of photoactive material may be used depending upon the liquid medium. The photoactive layer can be applied by any continuous or discontinuous liquid deposition technique. In one embodiment, the photoactive layer is applied by spin coating. In one embodiment, the photoactive layer is applied by ink jet printing. After liquid deposition, the liquid medium can be removed in air, in an inert atmosphere, or by vacuum, at room temperature or with heating. Optimal baking conditions depend on the vapor pressure properties of the liquids being removed and their molecular interaction with the liquids. In one embodiment, the deposited layer is heated to a temperature that is greater than the Tg of the material having the highest Tg. In one embodiment, the deposited layer is heated between 10 and 20° C. higher than the Tg of the material having the highest Tg. In one embodiment, the deposited layer is heated to a temperature that is less than the Tg of the material having the lowest Tg. In one embodiment, the heating temperature is at least 10° C. less than the lowest Tg. In one embodiment, the heating temperature is at least 20° C. less than the lowest Tg. In one embodiment, the heating temperature is at least 30° C. less than the lowest Tg. In one embodiment, the heating temperature is between 50° C. and 150° C. In one embodiment, the heating temperature is between 50° C. and 75° C. In one embodiment, the heating temperature is between 75° C. and 100° C. In one embodiment, the heating temperature is between 100° C. and 125° C. In one embodiment, the heating temperature is between 125° C. and 150° C. The heating time is dependent upon the temperature, and is generally between 5 and 60 minutes. In one embodiment, the final layer thickness is between 25 and 100 nm. In one embodiment, the final layer thickness is between 25 and 40 nm. In one embodiment, the final layer thickness is between 40 and 65 nm. In one embodiment, the final layer thickness is between 65 and 80 nm. In one embodiment, the final layer thickness is between 80 and 100 nm.

The electron transport layer can be deposited by any vapor deposition method. In one embodiment, it is deposited by thermal evaporation under vacuum. In one embodiment, the final layer thickness is between 1 and 100 nm. In one embodiment, the final layer thickness is between 1 and 15 nm. In one embodiment, the final layer thickness is between 15 and 30 nm. In one embodiment, the final layer thickness is between 30 and 45 nm. In one embodiment, the final layer thickness is between 45 and 60 nm. In one embodiment, the final layer thickness is between 60 and 75 nm. In one embodiment, the final layer thickness is between 75 and 90 nm. In one embodiment, the final layer thickness is between 90 and 100 nm.

The electron injection layer can be deposited by any vapor deposition method. In one embodiment, it is deposited by thermal evaporation under vacuum. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the material is heated to a temperature in the range of 100° C. to 400° C.; 150° C. to 350° C. preferably. The vapor deposition rates given herein are in units of Angstroms per second. In one embodiment, the material is deposited at a rate of 0.5 to 10 Å/sec. In one embodiment, the material is deposited at a rate of 0.5 to 1 Å/sec. In one embodiment, the material is deposited at a rate of 1 to 2 Å/sec. In one embodiment, the material is deposited at a rate of 2 to 3 Å/sec. In one embodiment, the material is deposited at a rate of 3 to 4 Å/sec. In one embodiment, the material is deposited at a rate of 4 to 5 Å/sec. In one embodiment, the material is deposited at a rate of 5 to 6 Å/sec. In one embodiment, the material is deposited at a rate of 6 to 7 Å/sec. In one embodiment, the material is deposited at a rate of 7 to 8 Å/sec. In one embodiment, the material is deposited at a rate of 8 to 9 Å/sec. In one embodiment, the material is deposited at a rate of 9 to 10 Å/sec. In one embodiment, the final layer thickness is between 0.1 and 3 nm. In one embodiment, the final layer thickness is between 0.1 and 1 nm. In one embodiment, the final layer thickness is between 1 and 2 nm. In one embodiment, the final layer thickness is between 2 and 3 nm.

The cathode can be deposited by any vapor deposition method. In one embodiment, it is deposited by thermal evaporation under vacuum. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the material is heated to a temperature in the range of 100° C. to 400° C.; 150° C. to 350° C. preferably. In one embodiment, the material is deposited at a rate of 0.5 to 10 Å/sec. In one embodiment, the material is deposited at a rate of 0.5 to 1 Å/sec. In one embodiment, the material is deposited at a rate of 1 to 2 Å/sec. In one embodiment, the material is deposited at a rate of 2 to 3 Å/sec. In one embodiment, the material is deposited at a rate of 3 to 4 Å/sec. In one embodiment, the material is deposited at a rate of 4 to 5 Å/sec. In one embodiment, the material is deposited at a rate of 5 to 6 Å/sec. In one embodiment, the material is deposited at a rate of 6 to 7 Å/sec. In one embodiment, the material is deposited at a rate of 7 to 8 Å/sec. In one embodiment, the material is deposited at a rate of 8 to 9 Å/sec. In one embodiment, the material is deposited at a rate of 9 to 10 Å/sec. In one embodiment, the final layer thickness is between 10 and 10000 nm. In one embodiment, the final layer thickness is between 10 and 1000 nm. In one embodiment, the final layer thickness is between 10 and 50 nm. In one embodiment, the final layer thickness is between 50 and 100 nm. In one embodiment, the final layer thickness is between 100 and 200 nm. In one embodiment, the final layer thickness is between 200 and 300 nm. In one embodiment, the final layer thickness is between 300 and 400 nm. In one embodiment, the final layer thickness is between 400 and 500 nm. In one embodiment, the final layer thickness is between 500 and 600 nm. In one embodiment, the final layer thickness is between 600 and 700 nm. In one embodiment, the final layer thickness is between 700 and 800 nm. In one embodiment, the final layer thickness is between 800 and 900 nm. In one embodiment, the final layer thickness is between 900 and 1000 nm. In one embodiment, the final layer thickness is between 1000 and 2000 nm. In one embodiment, the final layer thickness is between 2000 and 3000 nm. In one embodiment, the final layer thickness is between 3000 and 4000 nm. In one embodiment, the final layer thickness is between 4000 and 5000 nm. In one embodiment, the final layer thickness is between 5000 and 6000 nm. In one embodiment, the final layer thickness is between 6000 and 7000 nm. In one embodiment, the final layer thickness is between 7000 and 8000 nm. In one embodiment, the final layer thickness is between 8000 and 9000 nm. In one embodiment, the final layer thickness is between 9000 and 10000 nm.

EXAMPLES

The concepts described herein will be further described in the following examples, which do not limit the scope of the invention described in the claims.

Example 1

This example demonstrates the preparation and purification of dopant material E2.

6,12-Dibromochrysene

Under nitrogen atmosphere, a two-liter one-neck round-bottom flask was charged with chrysene (10 g, 43.8 mmol) and $CuBr_2/Al_2O_3$ (150 g, prepared as described in Kodomari et al., *J. Org. Chem.*, 1988, 53, 2093). Anhydrous carbon tetrachloride (1000 ml) was added by cannula. Reaction flask was then equipped with a magnetic stirrer and a condenser cooled to 12° C. with a circulating cold bath. Reaction mixture was left to stir in a 90° C. oil bath for 5 days. Progress of the reaction was monitored by TLC. Upon completion, reaction mixture was cooled to 48-50° C. and filtered. Filter cake was washed with a small amount of $CCl_4$ and filtrate was set aside. Upon standing, it gave 0.9 g of product, which was isolated by vacuum filtration. The filter cake was transferred to a one-liter round bottom flask and boiled in 500 ml of toluene for 3 h. The mixture was filtered while hot and washed with 1.5 l of warm (65° C.) toluene. Upon standing, the filtrate gave 8.9 g of fluffy yellow crystals. Total yield 9.81 g (58%). The compound was confirmed by NMR analysis.

N,N'-bis(4-iso-propylphenyl)-chrysene-6,12-diamine

In the drybox, a 500 mL one-neck round-bottom flask was charged with dibromochrysene (9 g, 23.3 mmol), 4-iso-propylaniline (6.61 g, 48.9 mmol) and 200 mL of dry toluene. In a separate 100 ml flask, $Pd_2(dba)_3$ (0.192 g, 0.21 mmol), $P(t-Bu)_3$ (0.085 g, 0.42 mmol) were dissolved in 25 ml of dry toluene, stirred for 10 minutes and then added to the dibromochrysene/aniline solution. After ten minutes of stirring, sodium tert-butoxide (4.48 g, 46.6 mmol) was added in one portion. The reaction flask was brought out of the drybox, capped with a nitrogen inlet and stirred in an 80° C. oil bath overnight (18 h). Next day, reaction mixture was cooled to room temperature, poured onto 15 g of silica gel and 15 g of celite, swirled around for a few minutes and filtered through a 4 inch plug of silica gel, washing with 5.5 liters of toluene. Volatiles were removed under vacuum to give a dark yellow solid. The solid was triturated with diethyl ether, vacuum filtered and washed with minimal amount of ether. The resulting yellow solid was dried on a high vacuum line. Yield 8.68 g (75.5%). The compound was confirmed by NMR analysis.

N,N'-bis(5-m-xylyl)-N,N'-bis(4-iso-propylphenyl)-chrysene-6,12-diamine

In the drybox, a 1 L one-neck round-bottom flask was charged with N,N'-bis(4-iso-propylphenyl)-chrysene-6,12-diamine (8.5 g, 17.18 mmol), 5-iodo-m-xylene (8.77 g, 37.8 mmol) and 300 ml of dry toluene. A separate 100 ml round-bottom flask was charged with $Pd_2(dba)_3$ (0.142 g, 0.115 mmol), $P(t-Bu)_3$ (0.063 g, 0.31 mmol) and 60 ml of dry toluene and left to stir. After 10 minutes, its contents were added to the larger solution (flask was rinsed with an additional 70 ml of toluene). Aftet ten minutes of stirring, sodium tert-butoxide (3.63 g, 37.8 mmol) was added in one portion. The reaction mixture turned brown after addition of the catalyst solution. Reaction flask was brought out of the drybox, capped with a nitrogen inlet and warmed in an 80° C. oil bath overnight (18 h). Reaction mixture was filtered through a 4" plug containing 2" of celite and 2" of silica gel and washed with 1 liter of toluene. Filtrate was concentrated under reduced pressure and the resulting dark oil was stirred with small amount of ether for 1 hour. The resulting solid was filtered and dried under vacuum. Yield 10.3 g (85.2%). The final product was further purified by train sublimation before testing. Final LC purity 98.9%. $^1$H NMR ($CD_2Cl_2$, □): 1.27 (d, 12H, $^3J_{HH}$=6.9 Hz), 2.22 (s, 12H), 2.90 (sept, 2H, $^3J_{HH}$=6.9 Hz), 6.65 (s, 2H), 6.78 (s, 4H), 7.11 (m, 8H), 7.55 (m, 2H), 7.65 (m, 2H), 8.17 (app d, 2H), 8.60 (app d, 2H), 8.63 (s, 2H).

Example 2

This example demonstrates the preparation and purification of dopant material E4.

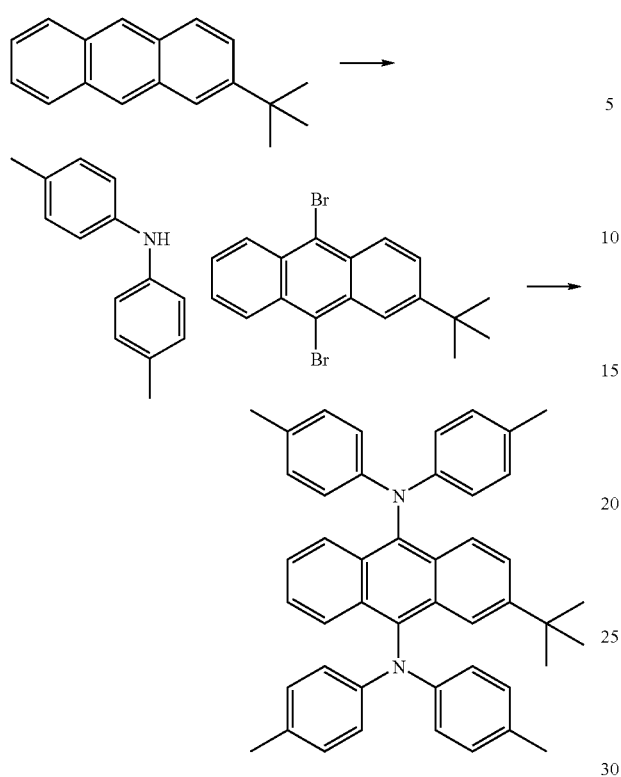

1. 2-tert-butylanthracene was brominated by dropwise addition of bromine to a solution of it in carbon tetrachloride. After stirring at room temperature for several hours, the solvent was removed under reduced pressure to give a crude yellow solid. The crude solid was purified by column chromatography to give a bright yellow solid as the product.
2. Di-t-tolylamine and 9,10-dibromo-2-tert-butylanthracene were combined in toluene with Pd2 dba3 and tri-t-butylphosphine. Sodium t-butoxide was slowly added and the reaction began to reflux. Thre reaction mixture was heated to 90 C overnight. During that time the mixture gelled. Upon cooling the reaction mixture was diluted with toluene and filtered. The solvent was removed under reduced pressure to give the crude product as a green solid. Upon purification by column chromatography using hexane as the eluant, a bright yellow solid (2-tert-butyl-N9,N9,N10,N10-tetra-p-tolylanthracene-9,10-diamine) was isolated.

Example 3

This example demonstrates the preparation and purification of host material H1.

H1 was prepared according to the following scheme:

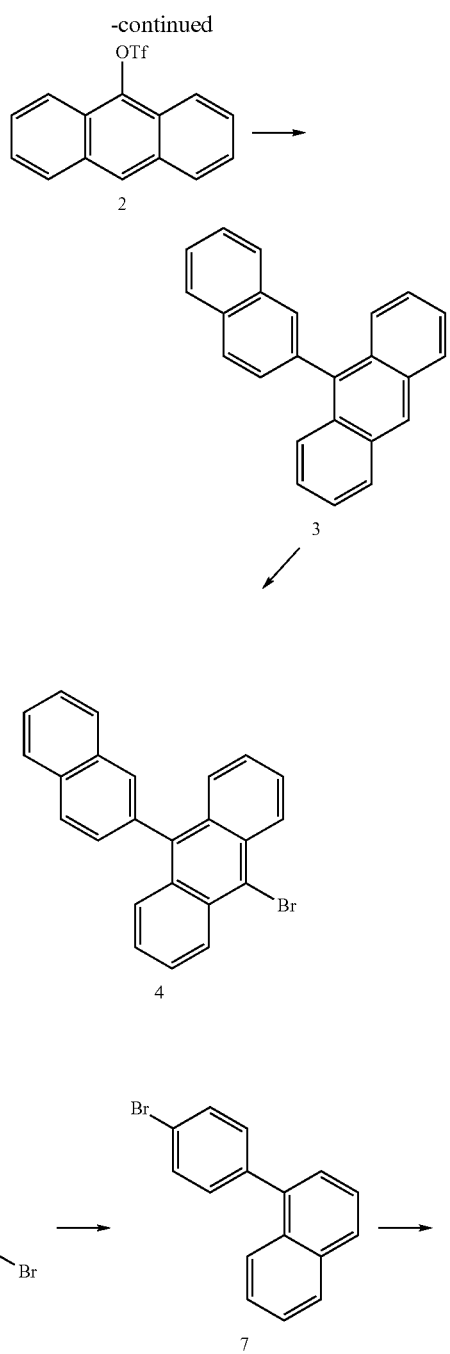

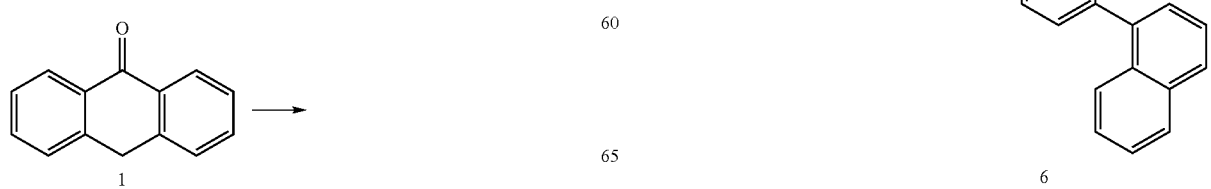

-continued
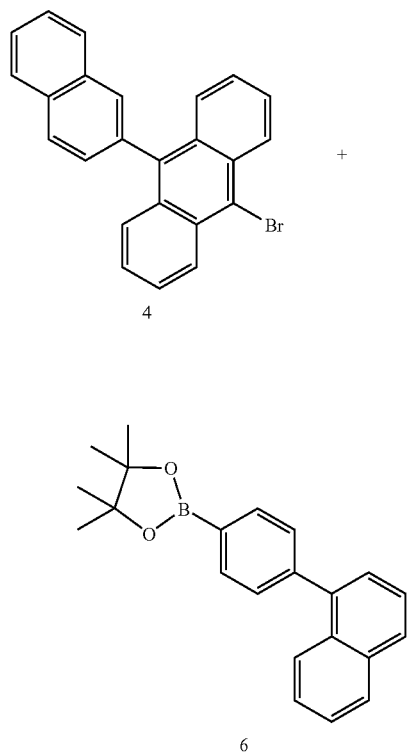
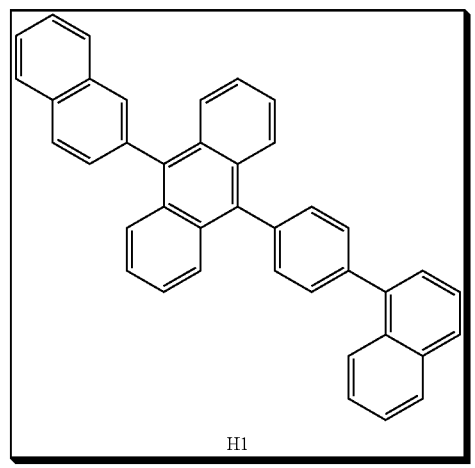
Synthesis of Compound 3
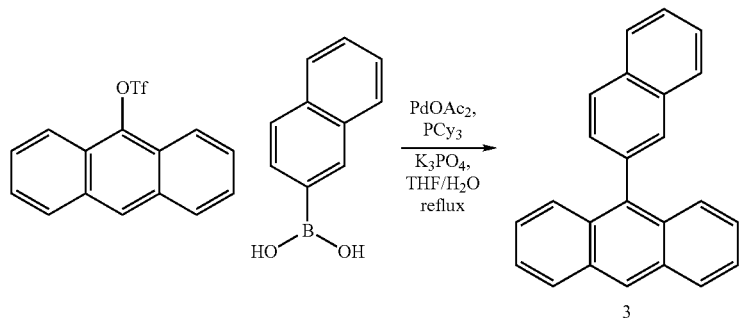
| Compound | Amount (g) | Amount (mol) | MW (g/mol) | Relative Equivalents |
|---|---|---|---|---|
| anthracen-9-yl trifluoromethanesulfonate | 10.0 | 0.0306 | 326.29 | 1.00 |
| Napthalen-2-yl-boronic acid | 6.33 | 0.0368 | 171.99 | 1.20 |
| Potassium phosphate tribasic | 29.2 | 0.137 | 212.27 | 4.5 |
| Palladium(II) acetate | 0.687 | 0.00306 | 224.51 | 0.10 |
| tricyclohexylphosphine | 0.858 | 0.00306 | 280.43 | 0.10 |
| tetrahydrofuran | 75 mL | | | |
| Water | 45 mL | | 18.02 | |
| 9-(naphthalen-2-yl)anthracene | 9.31 (theoretical) | 0.0306 | 304.38 | 1.00 |

All solid reagents and THF were combined in a 200 mL Kjeldahl reaction flask equipped with a stir bar in a nitrogen-filled glove box. After removal from the dry box, the reaction mixture was purged with nitrogen and degassed water was added by syringe. A condenser was then added and the reaction was refluxed for 24 hours. TLC was performed indicating the absence of the anthracen-9-yl trifluoromethanesulfonate starting material. After cooling the organic layer was separated and the aqueous layer was extracted with DCM. The organic fractions were combined and the solvent was removed under reduced pressure. The resulting crude solid was purified by column chromatography using Aldrich neutral alumina and 5% DCM in hexanes. The solvent polarity was increased gradually to 50% DCM. Solvent removal gave 4.08 g of a white solid (43.8% yield). The product was confirmed by NMR anaylsis.

Synthesis of Compound 7

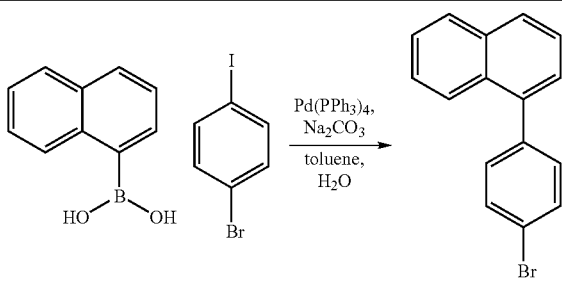

| Compound | Amount (g) | Amount (mol) | MW (g/mol) | Relative Equivalents |
|---|---|---|---|---|
| naphthalen-1-yl-1-boronic acid | 14.20 | 0.0826 | 171.99 | 1.00 |
| 1-bromo-4-iodobenzene | 25.8 | 0.0912 | 282.9 | 1.10 |
| Tetrakis(triphenylphospine)-palladium(0) | 1.2 | 0.00138 | 1155.56 | 0.0126 |
| sodium carbonate | 25.4 | 0.24 | 105.99 | 2.90 |
| toluene | 200 mL | | | |
| water | 120 mL | | | |
| 1-(4-bromophenyl)naphthalene | 23.4 (theoretical) | 0.0826 | 283.16 | 1.00 |

All reagents and toluene were combined in a 500 mL round bottom flask equipped with a stir bar in a nitrogen-filled glove box. After removal from the dry box, the reaction mixture was purged with nitrogen and degassed water was added by syringe. A condenser was equipped and the reaction was refluxed for 15 hours. TLC was performed indicating the reaction was complete. The reaction mixture was cooled to room temperature. The organic layer was separated and the aqueous layer was extracted with DCM. The organic fractions were combined and the solvent was removed under reduced pressure to give a viscous oil. The crude material was purified by column chromatography using silica gel and 10% DCM/Hexanes. Solvent removal gave 20 grams (85% yield) of a clear, viscous oil. The product was confirmed by NMR anaylsis.

Synthesis of H1

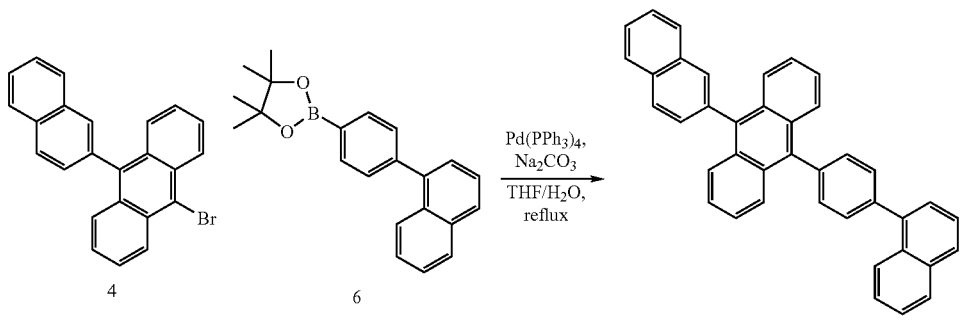

| Compound | Amount (g) | Amount (mol) | MW (g/mol) | Relative Equivalents |
|---|---|---|---|---|
| 10-bromo-9-(naphthalen-7-yl)anthracene | 1.00 | 0.00261 | 383.28 | 1.00 |
| 4,4,5,5-tetramethyl-2-(4-(naphthalen-4-yl)phenyl)-1,3,2-dioxaborolane | 0.95 | 0.0029 | 330.23 | 1.10 |
| Tetrakis-triphenylphosphinepalladium(0) | 0.15 | 0.00013 | 1155.56 | 0.05 |
| Sodium carbonate | 5.3 | 0.050 | 105.99 | |
| THF | 25 mL | | | |
| Water | 25 mL | | | |
| 10-(4-(naphthalen-1-yl)phenyl)-9-(naphthalen-7-yl)anthracene | 1.32 (theoretical) | | 506.63 | |

All reagents and THF were combined in a 100 mL round bottom flask equipped with a stir bar in a nitrogen-filled glove box. After removal from the dry box, the reaction mixture was purged with nitrogen and degassed water was added by syringe. A condenser was equipped and the reaction was refluxed for 72 hours. LC-MS was performed indicating the reaction was complete. The reaction mixture was cooled to room temperature. The organic layer was separated and the aqueous layer was extracted with DCM. The organic fractions were combined and the solvent was removed under reduced pressure to give a grey solid. The crude material was purified by column chromatography using silica gel and DCM/Hexanes. Solvent removal gave 1 gram (76% yield) as a white solid.

Host H1 was purified using both solution and vapor sublimation techniques. The material was recrystallized from chloroform-hexanes-methanol/2:2:1 to afford a light tan powder. This was followed by purification by column chromatography with commercially available packing materials and a solvent of chloroform-hexanes/1:4, which afforded a pristinely white powder which was determined to be >99.9% pure by HPLC analysis using a Waters Acquity Ultraperformance Liquid Chromatography system. Resulting material was dried under rough vacuum.

The previously solution purified material was purified further using a vapor sublimation technique. The final purity was determined to be at least 99.98% by integrated HPLC analysis.

The purity was also analyzed by UV-Vis spectrometry. 100.0 mg of H1 was weighed out to the nearest tenth of a milligram and dissolved in 3.0 mL of THF (Aldrich Chemical Co., anhydrous grade). The entire contents were added to a quartz cuvette while 3.0 mL of pure THF was added to a second cuvette. The THF spectrum blank was acquired to be subtracted from the H1 sample spectrum. The electronic absorption spectrum of a H1 sample was measured on a Cary UV-Vis spectrometer from 200-900 nm. The purified H1 material (3.33% wt:vol in THF) described above had an absorption <0.005 aborbance units from 460-1000 nm, using a Varian, Cary 50 UV-Vis spectrometer that has been blanked properly with neat THF. It will be understood that a 2% (wt/vol) of H1 in THF would have an even lower absorption.

Example 4

This example demonstrates the preparation of hole transport material P5.

(8)

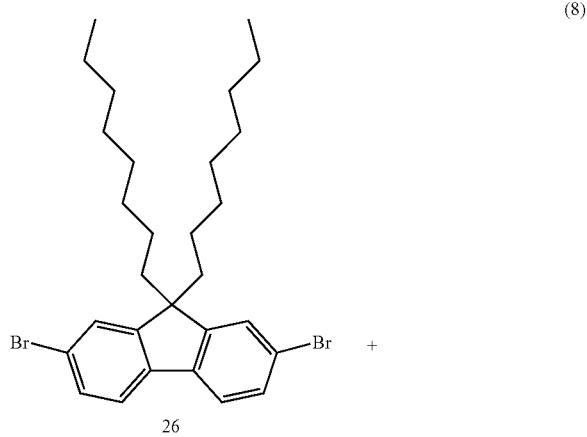

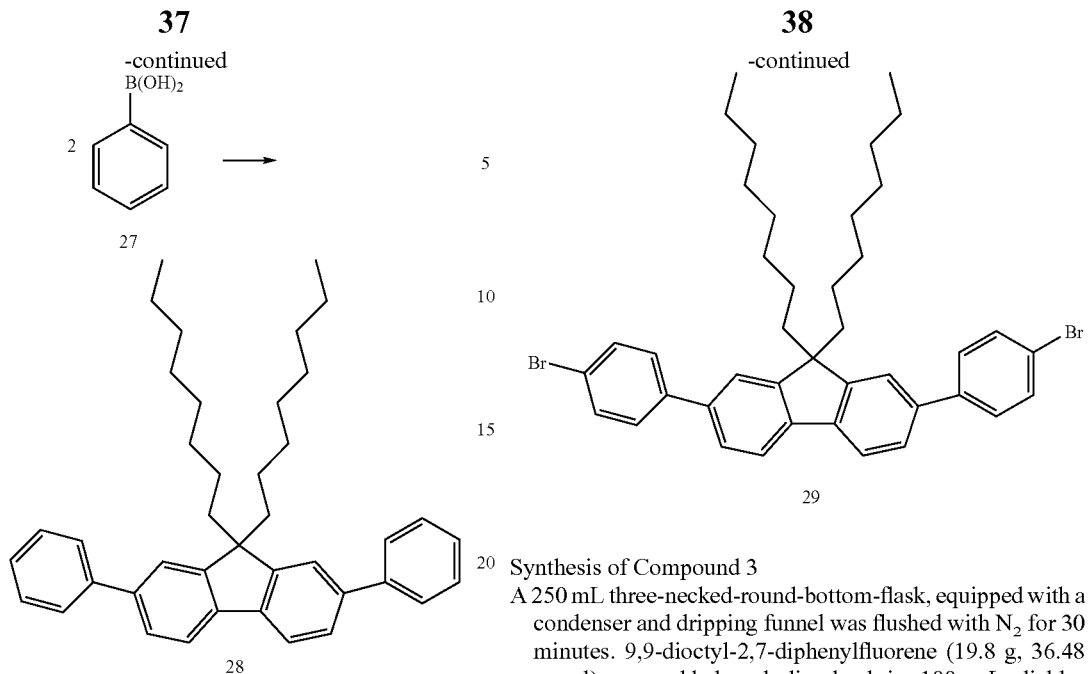

Synthesis of Compound 2

Under an atmosphere of nitrogen, a 250 mL round bottom was charged with 9,9-dioctyl-2,7-dibromofluorene (25.0 g, 45.58 mmol), phenylboronic acid (12.23 g, 100.28 mmol), Pd$_2$(dba)$_3$ (0.42 g, 0.46 mmol), P$^t$Bu$_3$ (0.22 g, 1.09 mmol) and 100 mL toluene. The reaction mixture stirred for five minutes after which KF (8.74 g, 150.43 mmol) was added in two portions and the resulting solution was stirred at room temperature overnight. The mixture was diluted with 500 mL THF and filtered through a plug of silica and celite and the volatiles were removed from the filtrate under reduced pressure. The yellow oil was purified by flash column chromatography on silica gel using hexanes as eluent. The product was obtained as a white solid in 80.0% (19.8 g). $^1$H NMR (500 MHz, CDCl$_3$) δ=7.78 (d, J=7.82 Hz, 2H), 7.69 (d, J=7.23 Hz, 4H), 7.60 (d, J=8.29 Hz, 4H), 7.48 (t, J=7.71 Hz, 4H), 7.36 (t, J=7.34 Hz, 2H), 2.07-2.04 (m, 4H), 1.22-0.08 (m, 20H), 0.81 (t, J=7.10 Hz, 6 H), 0.78-0.74 (m, 4H). $^{13}$C NMR (126 MHz, CDCl$_3$) δ=151.96 (s, 2C), 148.02 (s, 2C), 142.02 (s, 2C), 140.36 (s, 2C), 129.03 (d, 2C), 127.48 (d, 4C), 127.37 (d, 2C), 126.31 (d, 4C), 121.83 (d, 2C), 120.23 (d, 2C), 55.57 (s, 1C), 40.69 (t, 2C), 32.03 (t, 2C), 31.84 (t, 2C), 30.27 (t, 2C), 29.43 (t, 2C), 24.08 (t, 2C), 22.91 (t, 2C), 14.34 (q, 2C).

Synthesis of Compound 3

A 250 mL three-necked-round-bottom-flask, equipped with a condenser and dripping funnel was flushed with N$_2$ for 30 minutes. 9,9-dioctyl-2,7-diphenylfluorene (19.8 g, 36.48 mmol) was added and dissolved in 100 mL dichloromethane. The clear solution was cooled to −10° C. and a solution of bromine (12.24 g, 76.60 mmol) in 20 mL dichloromethane was added dropwise. The mixture was stirred for one hour at 0° C. and then allowed to warm to room temperature and stirred overnight. 100 mL of an aqueous 10% Na$_2$S$_2$O$_3$ solution was added and the reaction mixture was stirred for one hour. The organic layer was extracted and the water layer was washed three times with 100 mL dichloromethane. The combined organic layers were dried with Na$_2$SO$_4$ filtered and concentrated to dryness. Addition of acetone to the resulting oil gave a white precipitated. Upon filtration and drying a white powder was obtained (13.3 g, 52.2%). $^1$H NMR (500 MHz, CDCl$_3$) δ=7.74 (d, J=7.79 Hz, 2H), 7.58-7.55 (m, 4H), 7.53-7.49 (m, 8H), 2.02-1.99 (m, 4H), 1.18-1.04 (m, 20H), 0.77 (t, J=7.14 Hz, 6H), 0.72-0.66 (m, 4H). $^{13}$C NMR (126 MHz, CDCl$_3$) δ=152.14 (s, 2C), 140.83 (s, 2C), 140.55 (s, 2C), 139.26 (s, 2C), 132.13 (d, 4C), 129.04 (d, 2C), 126.20 (d, 4C), 121.63 (d, 2C), 121.58 (d, 2C), 120.46 (s, 2C), 55.63 (s, 1C), 40.60 (t, 2C), 32.03 (t, 2C), 30.21 (t, 2C), 29.43 (t, 2C), 29.40 (t, 2C), 24.06 (t, 2C), 22.84 (t, 2C), 14.29 (q, 2C).

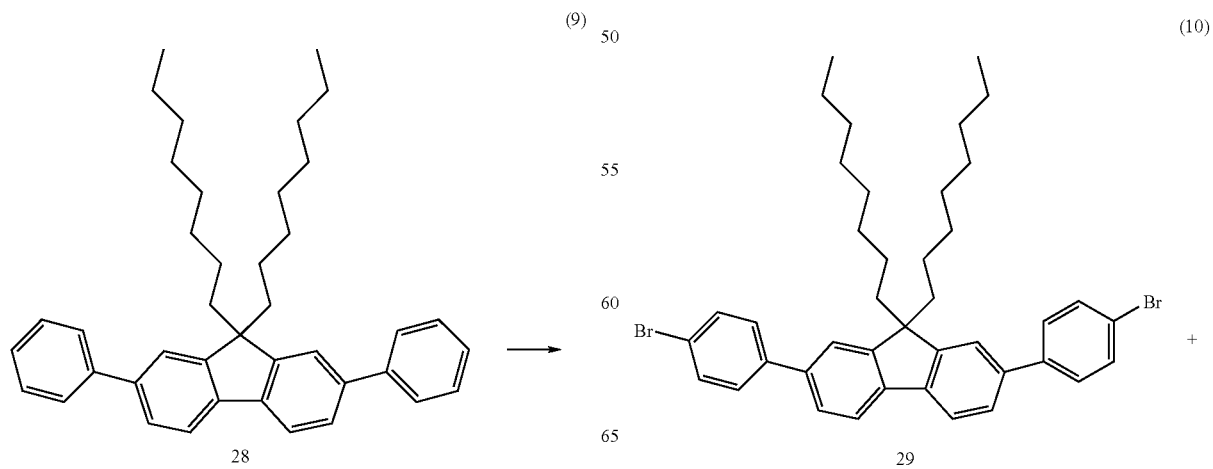

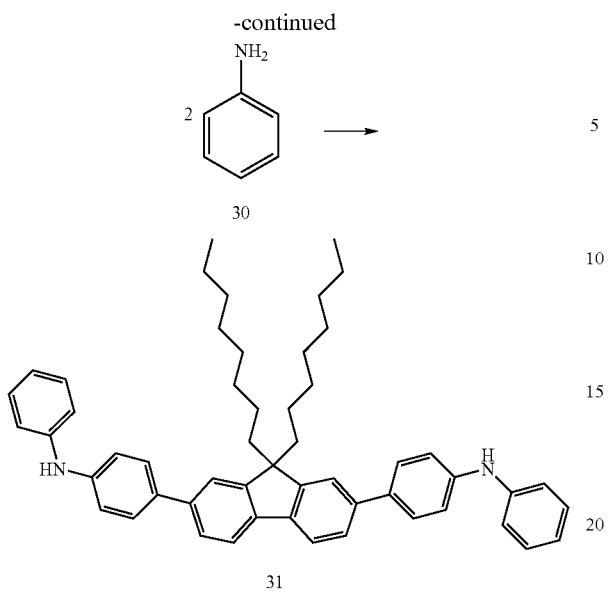

Synthesis of Compound 4

Under an atmosphere of nitrogen, a 250 mL round bottom was charged with 3 (13.1 g, 18.70 mmol), aniline (3.66 g, 39.27 mmol), Pd$_2$(dba)$_3$ (0.34 g, 0.37 mmol), P$^t$Bu$_3$ (0.15 g, 0.75 mmol) and 100 mL toluene. The reaction mixture stirred for 10 min after which NaO$^t$Bu (3.68 g, 38.33 mmol) was added and the reaction mixture was stirred at room temperature for one day. The resulting reaction mixture was diluted with 3 L toluene and filtered through a plug of silica and celite. Upon evaporation of volatiles, the dark brown oil obtained was purified by flash column chromatography on silica gel using a mixture of 1:10 ethyl acetate: hexanes as eluent. The product was obtained as a pale yellow powder in 50.2% (6.8 g). $^1$H NMR (500 MHz, CD$_2$Cl$_2$) δ=7.77 (d, J=7.87 Hz, 2H), 7.34-7.58 (m, 8H), 7.31 (t, J=7.61 Hz, 4H), 7.19 (d, J=8.14 Hz, 4H), 7.15 (d, J=8.40 Hz, 4H), 6.97 (t, J=7.61 Hz, 2H), 5.91 (bs, 2H), 2.01-2.07 (m, 4H), 1.23-1.07 (m, 20H), 0.82 (t, J=7.01 Hz, 6H), 0.78-0.72 (m, 4H). $^{13}$C NMR (126 MHz, CD$_2$Cl$_2$) δ=152.33 (s, 2C), 143.63 (s, 2C), 143.15 (s, 2C), 140.20 (s, 2C), 140.16 (s, 2C), 134.66 (d, 2C), 129.96 (d, 4C), 128.49 (d, 4C), 125.84 (d, 2C), 121.69 (s, 2C), 121.46 (d, 2C), 120.42 (d, 4C), 118.48 (d, 4C), 118.35 (d, 2C), 55.86 (s, 1C), 41.02 (t, 2C), 32.39 (t, 2C), 30.63 (t, 2C), 29.81 (t, 2C), 29.72 (t, 2C), 24.51 (t, 2C), 23.20 (t, 2C), 14.43 (q, 2C).

(11)

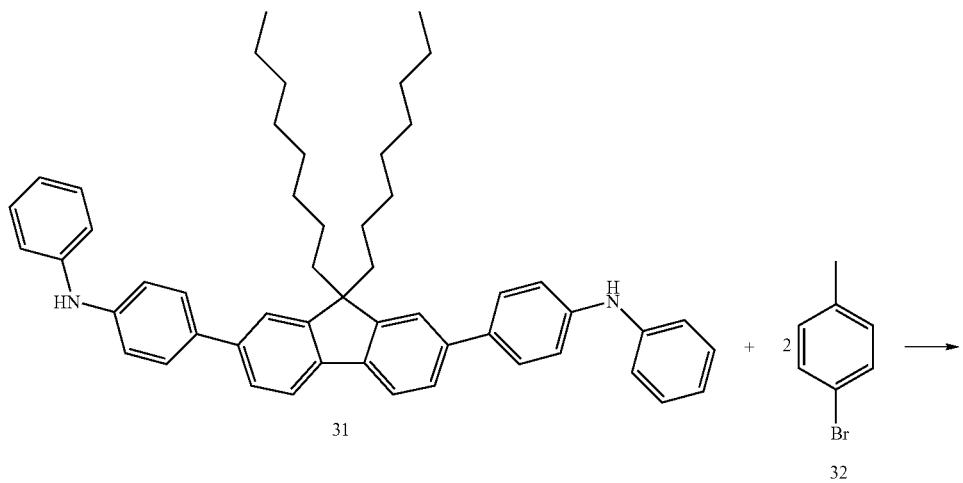

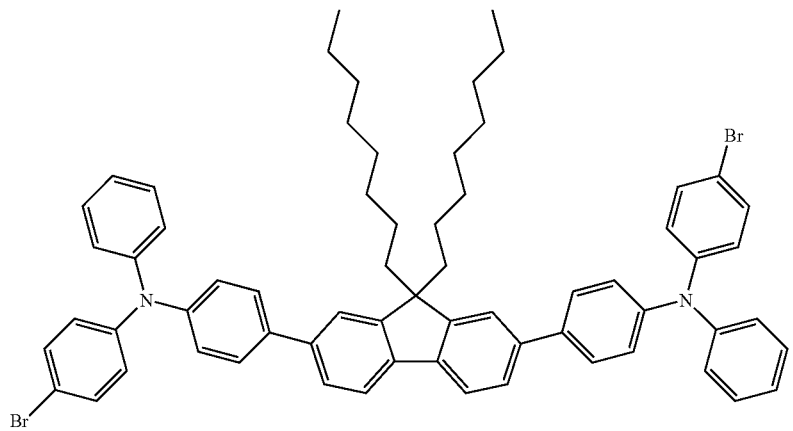

Synthesis of Compound 5

In a 250 mL three-necked-round-bottom-flask equipped with condenser, 4 (4.00 g, 5.52 mmol), 1-bromo-4-iodobenzene (4.68 g, 16.55 mmol), Pd$_2$(dba)$_3$ (0.30 g, 0.33 mmol) and DPPF (0.37 g, 0.66 mmol) were combined with 80 mL toluene. The resultant mixture was stirred for 10 min. NaO$^t$Bu (1.17 g, 12.14 mmol) was added and the mixture was heated to 80° C. for four days. The resulting reaction mixture was diluted with 1 L toluene and 1 L THF filtered through a plug of silica and celite to remove the insoluble salts. Upon evaporation of volatiles, the resulting brown oil was purified by flash column chromatography on silica gel using a mixture of 1:10 dichloromethane:hexanes as eluent. After drying a yellow powder was obtained (4.8 g, 84.8%). $^1$H NMR (500 MHz, CD$_2$Cl$_2$) δ=7.78 (d, J=7.71 Hz, 2H), 7.63-7.59 (m, 8H), 7.39 (d, J=8.88 Hz, 4H), 7.32 (t, J=7.94, Hz, 4H), 7.17 (dd, J=8.14, 9.34 Hz, 8H), 7.11 (t, J=7.48 Hz, 2H), 7.03 (d, J=8.88 Hz, 4H), 2.12-2.09 (m, 4H), 1.24-1.10 (m, 20H), 0.82 (t, J=7.01 Hz, 6H), 0.79-0.73 (m, 4H). $^{13}$C NMR (126 MHz, CD$_2$Cl$_2$) δ=152.40 (s, 2C), 147.89 (s, 2C), 147.62 (s, 2C), 147.21 (s, 2C), 140.50 (s, 2C), 139.91 (s, 2C), 136.84 (d, 4C), 132.80 (s, 2C), 130.08 (d, 2C), 128.52 (d, 2C), 126.14 (d, 4C), 125.84 (d, 2C), 125.29 (d, 4C), 125.02 (d, 4C), 124.14 (d, 2C), 121.65 (d, 4C), 120.62 (d, 4C), 115.43 (s, 2C), 55.93 (s, 1C), 41.02 (t, 2C), 32.40 (t, 2C), 30.63 (t, 2C), 29.83 (t, 2C), 29.82 (t, 2C), 24.52 (t, 2C), 23.22 (t, 2C), 14.48 (q, 2C).

Synthesis of Compound 6

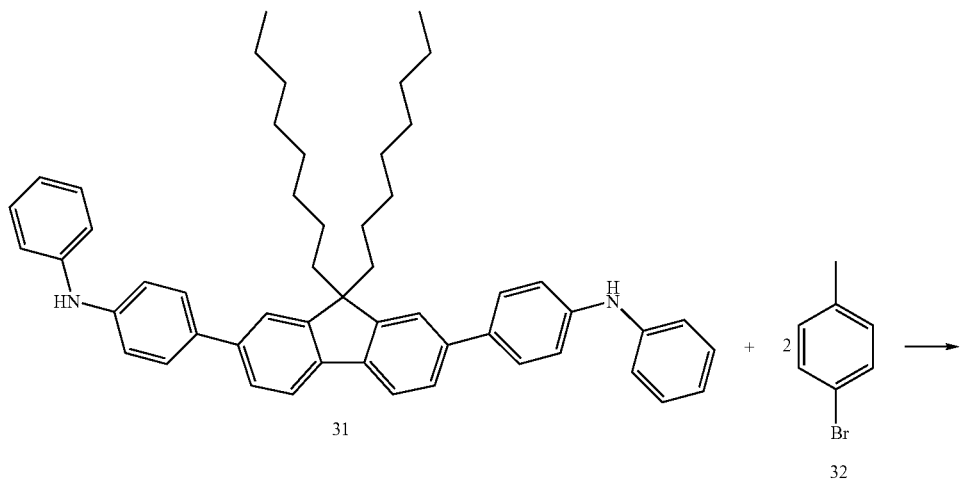

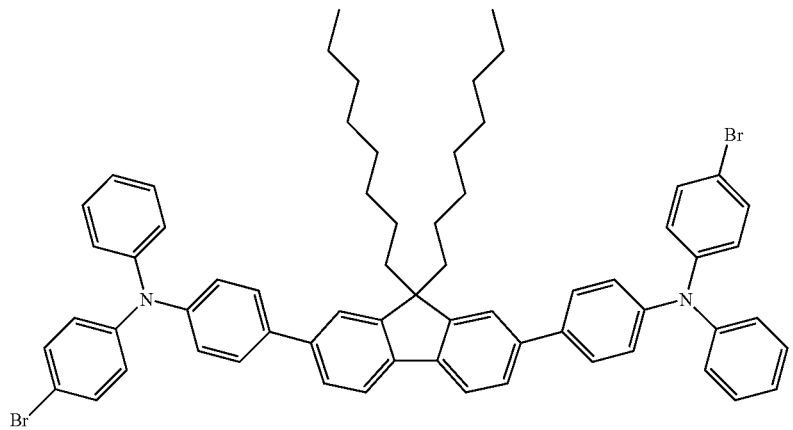

Bis(1,5-Cyclooctadiene)-nickel-(0) (0.556 g, 2.02 mmol) was added to a N,N-dimethylformamide (anhydrous, 4 mL) solution 2,2'-bipyridyl (0.0.315 g, 2.02 mmol) and 1,5-cyclooctadiene (0.219 g, 2.02 mmol). The resulting mixture was heated to 60 C for 30 min. A toluene (anhydrous, 16 mL) solution of 9,9-dioctyl-2,7-dibenzylfluorene (0.0834 g, 0.15 mmol) and compound 5 (0.88 g, 0.85 mmol), was then added rapidly to the stirring catalyst mixture. The mixture was stirred at 60 C for seven hours. After the reaction mixture cooled to room temperature, it was poured, slowly, with vigorous stirring into 250 mL methanol and stirred overnight. Addition of 15 mL of conc. HCl followed and stirring for an hour. The precipitate was filtered and then added to 50 mL of toluene and poured slowly into 500 mL of methanol. The resulting light-yellow precipitate was stirred for one hour and then isolated by filtration. The solid was further purified by chromatography (silica, toluene) and precipitation from ethyl acetate. After drying the resulting material under vacuum a light yellow polymer was isolated in 80% yield (0.64 g). GPC (THF, room temperature): Mn=80, 147; Mw=262, 659; Mw/Mn=2.98.

Synthesis of Compound 7

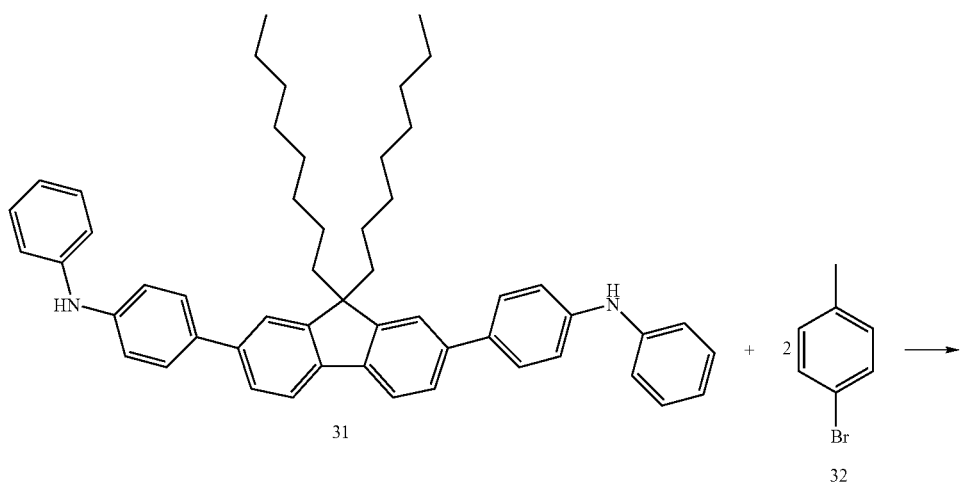

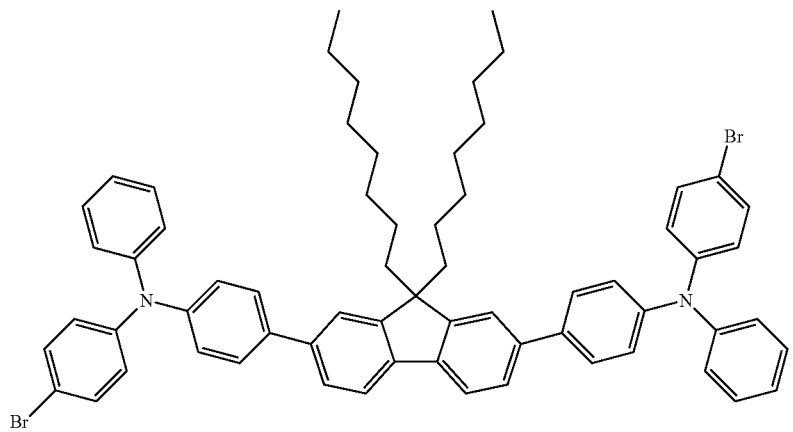

Bis(1,5-Cyclooctadiene)-nickel-(0) (0.833 g, 3.03 mmol) was added to a N,N-dimethylformamide (anhydrous, 6 mL) solution 2,2'-bipyridyl (0.473 g, 3.03 mmol) and 1,5-cyclooctadiene (0.328 g, 3.03 mmol). The resulting mixture was heated to 60 C for 30 min. A toluene (anhydrous, 24 mL) solution compound 5 (1.553 g, 1.50 mmol), was then added rapidly to the stirring catalyst mixture. The mixture was stirred at 60 C for seven hours. After the reaction mixture cooled to room temperature, it was poured, slowly, with vigorous stirring into 250 mL methanol and stirred overnight. Addition of 15 mL of conc. HCl followed and stirring for an hour. The precipitate was filtered and then added to 50 mL of toluene and poured slowly into 500 mL of methanol. The resulting light-yellow precipitate was stirred for one hour and then isolated by filtration. The solid was further purified by chromatography (silica, toluene) and precipitation from ethyl acetate. After drying the resulting material under vacuum a light yellow polymer was isolated in 82% yield (1.08 g). GPC (THF, room temperature): Mn=148,427; Mw=477,886; Mw/Mn=3.25.

Example 5

This example demonstrates the preparation of hole transport material P3.

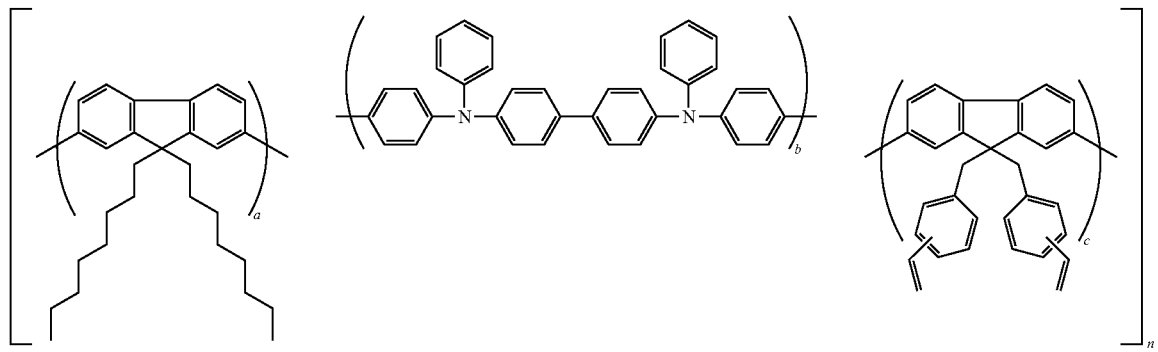

a:b:c = 4:5:1

Bis(1,5-Cyclooctadiene)-nickel-(0) (1.111 g, 4.04 mmol) was added to a N,N-dimethylformamide (anhydrous, 4 mL) solution 2,2'-bipyridyl (0.631 g, 4.04 mmol) and 1,5-cyclooctadiene (0.437 g, 4.04 mmol). The resulting mixture was heated to 60 C for 30 min. A toluene (anhydrous, 16 mL) solution of 9,9-dioctyl-2,7-dibromofluorene (0.439 g, 0.80 mmol), N,N'-Bis(4-bromophenyl)-N,N'-diphenylbenzidine (0.646 g, 1.00 mmol), of 9,9-Bis(vinylbenzyl)-2,7-dibromofluorene (0.111 g, 0.02 mmol) was then added rapidly to the stirring catalyst mixture. The mixture was stirred at 60 C for eight hours. After the reaction mixture cooled to room temperature, it was poured, slowly, with vigorous stirring into 300 mL methanol and stirred overnight. Addition of 25 mL of conc. HCl followed and stirring for an hour. The precipitate was filtered and then added to 100 mL of toluene and poured slowly into 1 L of 1:1 methanol:acetone solution which contained 25 mL conc. HCl. The resulting yellow precipitate was stirred for 30 min and then isolated by filtration. The solid was further purified by chromatography (silica, toluene) and precipitation from ethyl acetate. After drying the resulting material under vacuum a light yellow polymer was isolated in 77% yield (0.680 g). GPC (THF, room temperature): Mn=27,874; Mw=135,037; Mw/Mn=4.85.

Example 6

Example 6 demonstrates the preparation of a hole transport polymer P8.

Part 1—Synthesis of Monomer (Compound 5 below):

Synthesis of Compound 2

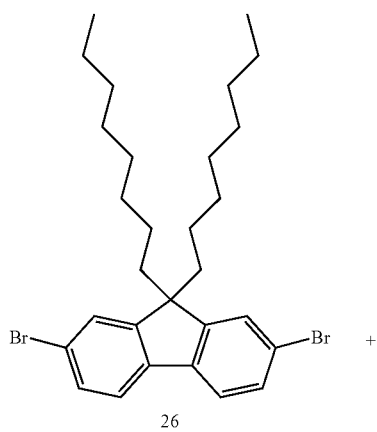

(8)

26

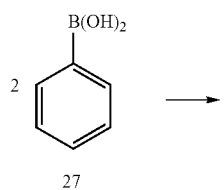

27

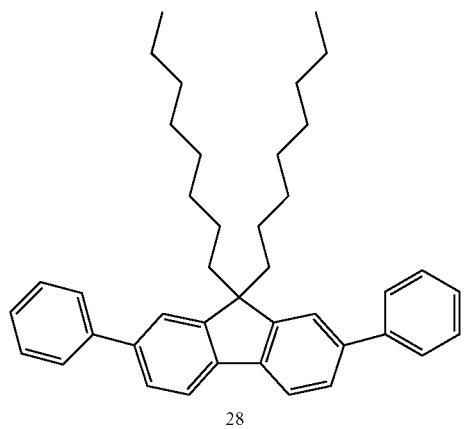

28

Under an atmosphere of nitrogen, a 250 mL round bottom was charged with 9,9-dioctyl-2,7-dibromofluorene (25.0 g, 45.58 mmol), phenylboronic acid (12.23 g, 100.28 mmol), Pd$_2$(dba)$_3$ (0.42 g, 0.46 mmol), P$^t$Bu$_3$ (0.22 g, 1.09 mmol) and 100 mL toluene. The reaction mixture stirred for five minutes after which KF (8.74 g, 150.43 mmol) was added in two portions and the resulting solution was stirred at room temperature overnight. The mixture was diluted with 500 mL THF and filtered through a plug of silica and celite and the volatiles were removed from the filtrate under reduced pressure. The yellow oil was purified by flash column chromatography on silica gel using hexanes as eluent. The product was obtained as a white solid in 80.0% (19.8 g). Analysis by NMR indicated the material to be compound 2 having structure given above.

Synthesis of Compound 3

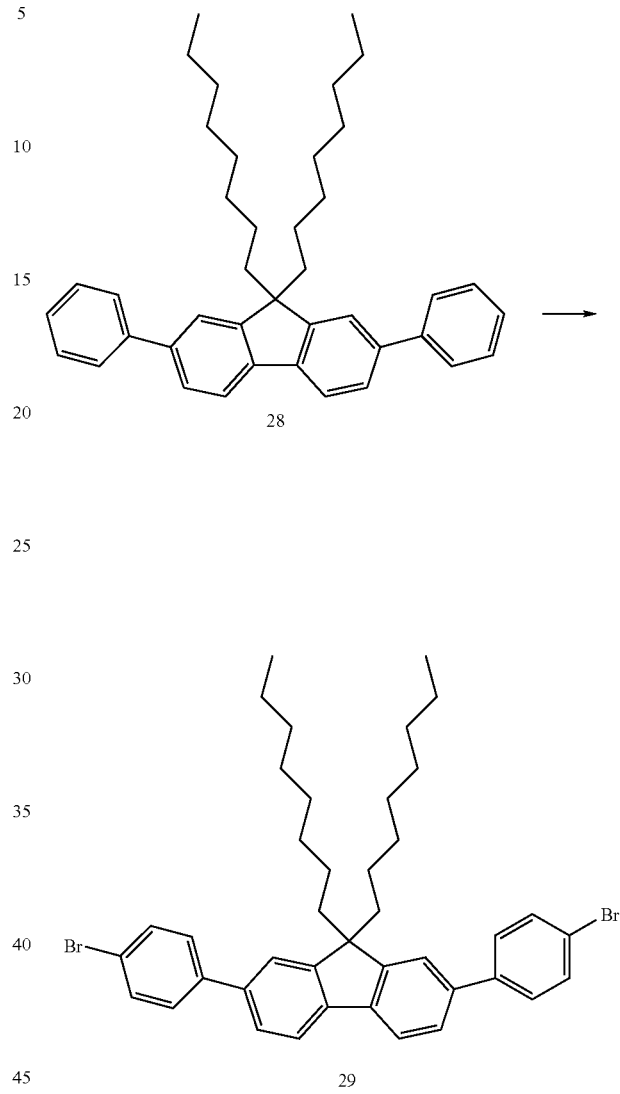

A 250 mL three-necked-round-bottom-flask, equipped with a condenser and dripping funnel was flushed with N$_2$ for 30 minutes. 9,9-dioctyl-2,7-diphenylfluorene (19.8 g, 36.48 mmol) was added and dissolved in 100 mL dichloromethane. The clear solution was cooled to −10° C. and a solution of bromine (12.24 g, 76.60 mmol) in 20 mL dichloromethane was added dropwise. The mixture was stirred for one hour at 0° C. and then allowed to warm to room temperature and stirred overnight. 100 mL of an aqueous 10% Na$_2$S$_2$O$_3$ solution was added and the reaction mixture was stirred for one hour. The organic layer was extracted and the water layer was washed three times with 100 mL dichloromethane. The combined organic layers were dried with Na$_2$SO$_4$ filtered and concentrated to dryness. Addition of acetone to the resulting oil gave a white precipitated. Upon filtration and drying a white powder was obtained (13.3 g, 52.2%). Analysis by NMR indicated the material to be compound 3 having structure given above.

Synthesis of Compound 4

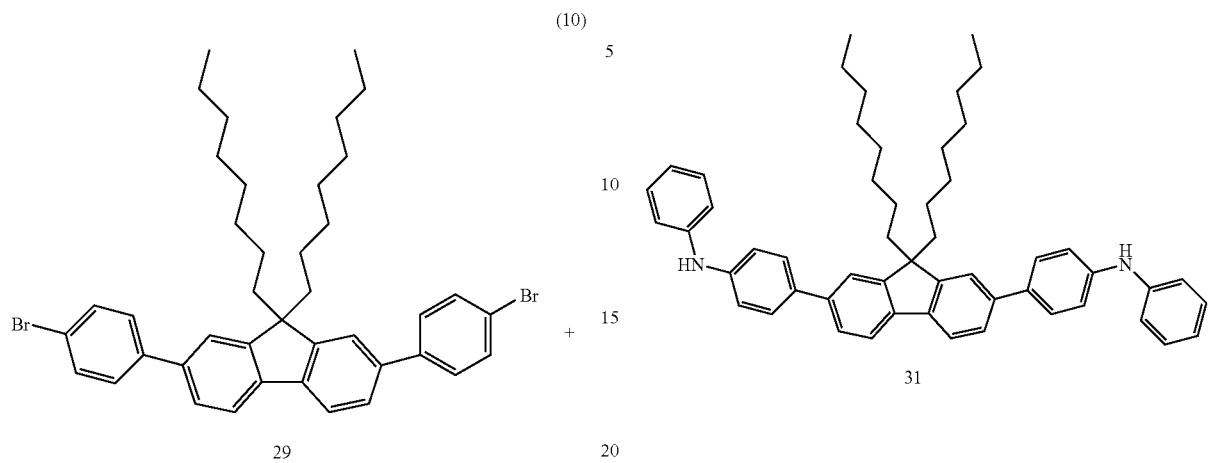

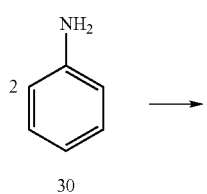

Under an atmosphere of nitrogen, a 250 mL round bottom was charged with 3 (13.1 g, 18.70 mmol), aniline (3.66 g, 39.27 mmol), Pd$_2$(dba)$_3$ (0.34 g, 0.37 mmol), P$^t$Bu$_3$ (0.15 g, 0.75 mmol) and 100 mL toluene. The reaction mixture stirred for 10 min after which NaO$^t$Bu (3.68 g, 38.33 mmol) was added and the reaction mixture was stirred at room temperature for one day. The resulting reaction mixture was diluted with 3 L toluene and filtered through a plug of silica and celite. Upon evaporation of volatiles, the dark brown oil obtained was purified by flash column chromatography on silica gel using a mixture of 1:10 ethyl acetate: hexanes as eluent. The product was obtained as a pale yellow powder in 50.2% (6.8 g). Analysis by NMR indicated the material to be compound 4 having structure given above.

Synthesis of Compound 5

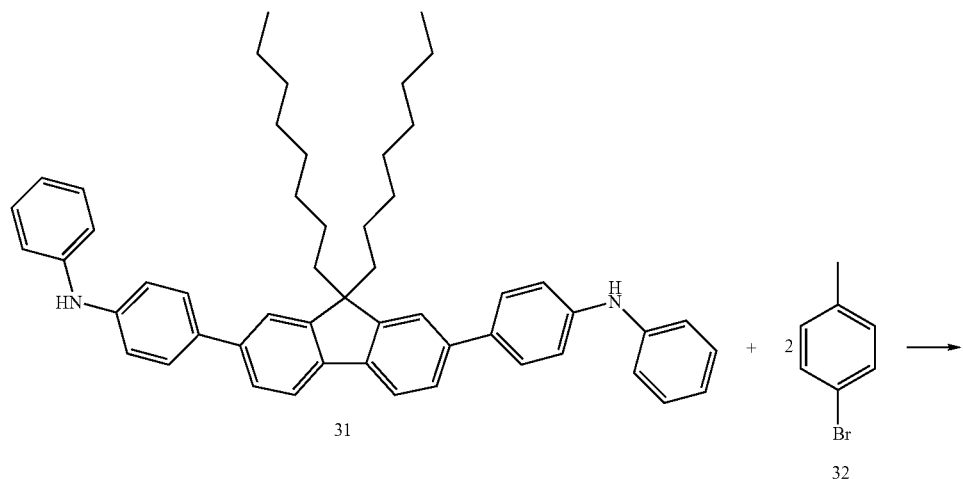

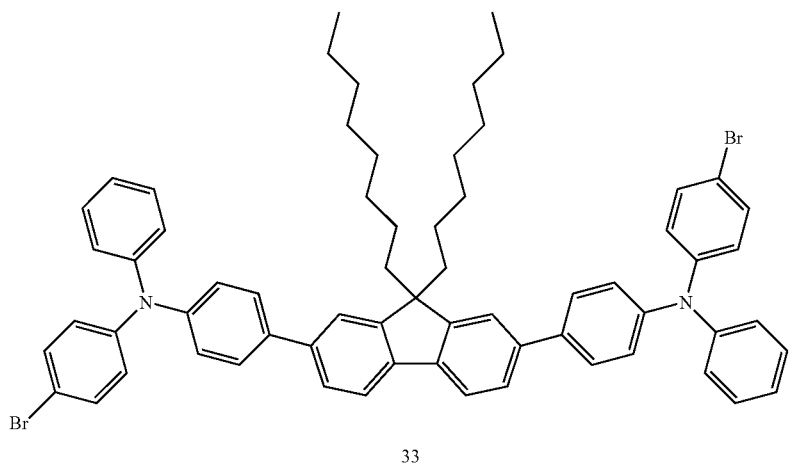

33

In a 250 mL three-necked-round-bottom-flask equipped with condenser, 4 (4.00 g, 5.52 mmol), 1-bromo-4-iodobenzene (4.68 g, 16.55 mmol), $Pd_2(dba)_3$ (0.30 g, 0.33 mmol) and DPPF (0.37 g, 0.66 mmol) were combined with 80 mL toluene. The resultant mixture was stirred for 10 min. NaO$^t$Bu (1.17 g, 12.14 mmol) was added and the mixture was heated to 80° C. for four days. The resulting reaction mixture was diluted with 1 L toluene and 1 L THF filtered through a plug of silica and celite to remove the insoluble salts. Upon evaporation of volatiles, the resulting brown oil was purified by flash column chromatography on silica gel using a mixture of 1:10 dichloromethane:hexanes as eluent. After drying a yellow powder was obtained (4.8 g, 84.8%). Analysis by NMR indicated the material to be compound 5 having structure given above.

Part 2—Synthesis of Homopolymer P8, from Monomer 5 Above Using Yamamoto Polymerization.

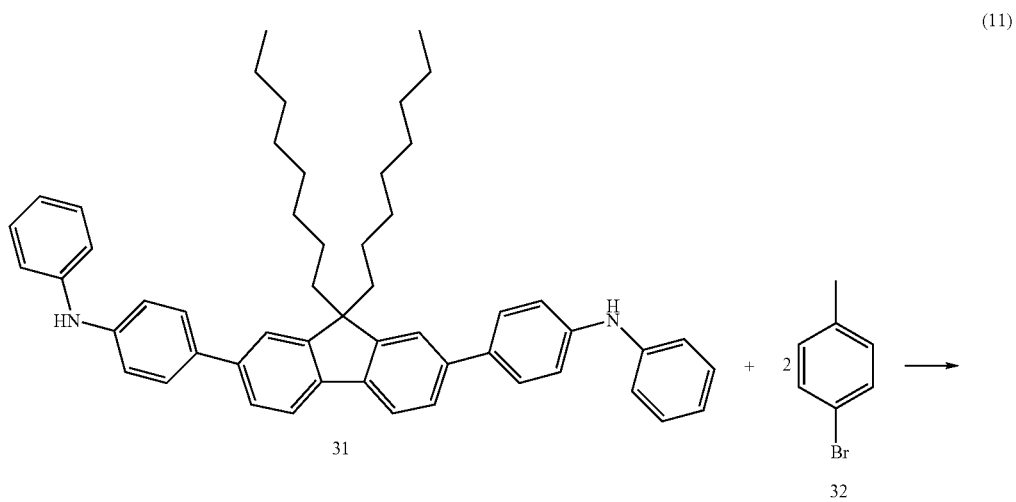

(11)

-continued

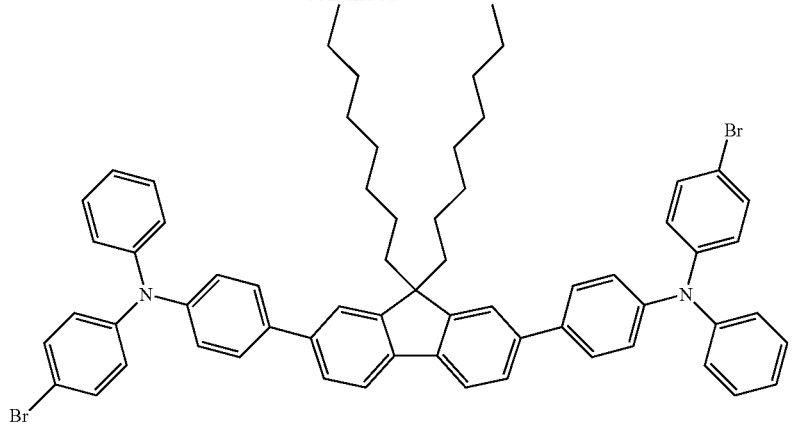

33

Bis(1,5-Cyclooctadiene)-nickel-(0) (0.833 g, 3.03 mmol) was added to a N,N-dimethylformamide (anhydrous, 6 mL) solution 2,2'-bipyridyl (0.473 g, 3.03 mmol) and 1,5-cyclooctadiene (0.328 g, 3.03 mmol). The resulting mixture was heated to 60 C for 30 min. A toluene (anhydrous, 24 mL) solution compound 5 (1.553 g, 1.50 mmol), was then added rapidly to the stirring catalyst mixture. The mixture was stirred at 60 C for seven hours. After the reaction mixture cooled to room temperature, it was poured, slowly, with vigorous stirring into 250 mL methanol and stirred overnight. Addition of 15 mL of conc. HCl followed and stirring for an hour. The precipitate was filtered and then added to 50 mL of toluene and poured slowly into 500 mL of methanol. The resulting light-yellow precipitate was stirred for one hour and then isolated by filtration. The solid was further purified by chromatography (silica, toluene) and precipitation from ethyl acetate. After drying the resulting material under vacuum a light yellow polymer was isolated in 82% yield (1.08 g). GPC (THF, room temperature): Mn=148,427; Mw=477,886; Mw/Mn=3.25.

Example 7

This example demonstrates the fabrication and performance of a device having blue emission. The following materials were used:

Indium Tin Oxide (ITO): 50 nm buffer layer=Buffer 1 (25 nm), which is an aqueous dispersion of polypyrrole and a polymeric fluorinated sulfonic acid. The material was prepared using a procedure similar to that described in Example 1 of published U.S. patent application no. 2005/0205860.

hole transport layer=polymer P5 (20 nm)
    photoactive layer=13:1 host H1: dopant E2 (48 nm)
    electron transport layer=tris(8-hydroxyquinolato)aluminum (AlQ) (20 nm)
    cathode=LiF/Al (0.5/100 nm)

OLED devices were fabricated by a combination of solution processing and thermal evaporation techniques. Patterned indium tin oxide (ITO) coated glass substrates from Thin Film Devices, Inc were used. These ITO substrates were based on Corning 1737 glass coated with ITO having a sheet resistance of 30 ohms/square and 80% light transmission. The patterned ITO substrates were cleaned ultrasonically in aqueous detergent solution and rinsed with distilled water. The patterned ITO was subsequently cleaned ultrasonically in acetone, rinsed with isopropanol, and dried in a stream of nitrogen.

Immediately before device fabrication the cleaned, patterned ITO substrates were treated with UV ozone for 10 minutes. Immediately after cooling, an aqueous dispersion of Buffer 1 was spin-coated over the ITO surface and heated to remove solvent. After cooling, the substrates were then spin-coated with a solution of a hole transport material, and then heated to remove solvent. After cooling the substrates were spin-coated with the emissive layer solution, and heated to remove solvent. The substrates were masked and placed in a vacuum chamber. A AlQ layer was deposited by thermal evaporation, followed by a layer of LiF. Masks were then changed in vacuo and a layer of Al was deposited by thermal evaporation. The chamber was vented, and the devices were encapsulated using a glass lid, dessicant, and UV curable epoxy.

The OLED samples were characterized by measuring their (1) current-voltage (I-V) curves, (2) electroluminescence radiance versus voltage, and (3) electroluminescence spectra versus voltage. All three measurements were performed at the same time and controlled by a computer. The current efficiency of the device at a certain voltage is determined by dividing the electroluminescence radiance of the LED by the current density needed to run the device. The unit is a cd/A. The power efficiency is the current efficiency divided by the operating voltage. The unit is lm/W.

Example 8

This example shows the performance of a device made with different hole transport materials.

One device was made using the procedure of Example 7, except that the hole transport layer was P3 (Example 8-1).

One device was made using the procedure of Example 7, except that the hole transport layer was P8 (Example 8-2).

Comparative Example A

This comparative example shows the performance of a device made with a different buffer material.

A device was made using the procedure of Example 7, except that the buffer layer was Baytron P (Al 4083) commercially available from Stark.

Comparative Example B

This comparative example shows the performance of a device made with less pure host material.

A device was made using the procedure of Example 7, except that H1 having HPLC purity of 99.98% and impurity absorbance <0.005 was replaced with H1 having HPLC purity of 99.98% and impurity absorbance of 0.04.

Comparative Example C

This comparative example shows the performance of a device made with less pure dopant material.

A device was made using the procedure of Example 7, except that E2 having 99.81% HPLC purity was replaced with E2 having 99.00% HPLC purity.

Comparative Example D

This comparative example shows the performance of a device made with less pure host and less pure dopant material.

A device was made using the procedure of Example 7, except that H1 having HPLC purity of 99.98% and impurity absorbance <0.005 was replaced with H1 having HPLC purity of 99.98% and impurity absorbance of 0.04; and E2 having HPLC purity of 99.81% was replaced with E2 having 99.00% HPLC purity.

TABLE 1

| Example | CE [cd/A] | Voltage (V) | CIE [x] | CIE [y] | Lum. ½ Life [h] |
|---|---|---|---|---|---|
| 7 | 4.0 | 5.7 | 0.140 | 0.145 | 1255 |
| 8-1 | 4.8 | 6.6 | 0.143 | 0.154 | 1152 |
| 8-2 | 3.6 | 5.5 | 0.144 | 0.152 | 1185 |
| Comp A | 3.3 | 8.8 | 0.140 | 0.144 | 18 |
| Comp B | 3.9 | 6.3 | 0.140 | 0.156 | 604 |
| Comp C | 4.1 | 6.1 | 0.140 | 0.160 | 1003 |
| Comp D | 3.9 | 6.0 | 0.140 | 0.156 | 470 |

* All data @ 2000 nits, CE = current efficiency

It can be seen from the above data, that devices made with higher purity host material have significantly greater lifetimes. Increasing the purity of the dopant, also increases the lifetime.

Example 9

This example demonstrates the fabrication and performance of a device having green emission. The following materials were used:
Indium Tin Oxide (ITO): 50 nm
buffer layer=Buffer 1 (25 nm).
hole transport layer=polymer P5 (20 nm)
photoactive layer=13:1 host H1 EL material E4 (48 nm)
electron transport layer=tris(8-hydroxyquinolato)aluminum (AlQ) (20 nm)
cathode=LiF/Al (0.5/100 nm)

TABLE 2

| Example | CE [cd/A] | Voltage (V) | CIE [x] | CIE [y] | Lum. ½ Life [h] |
|---|---|---|---|---|---|
| 9 | 14.0 | 4.8 | 0.30 | 0.64 | 17472 |

* All data @ 2000 nits, CE = current efficiency

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. The use of numerical values in the various ranges specified herein is stated as approximations as though the minimum and maximum values within the stated ranges were both being preceded by the word "about." In this manner, slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. An organic electronic device comprising
    a hole transport layer, and
    a photoactive layer comprising a dopant material and a host material, wherein each of said materials has an HPLC purity of at least 99.9% and an impurity absorbance no greater than 0.01.

2. The device of claim 1, wherein the hole transport layer comprises a polymer selected from the group consisting of arylamine polymers and copolymers of fluorene and arylamine monomers.

3. The device of claim 2, wherein the polymer is crosslinked.

4. The device of claim 2, wherein the polymer is selected
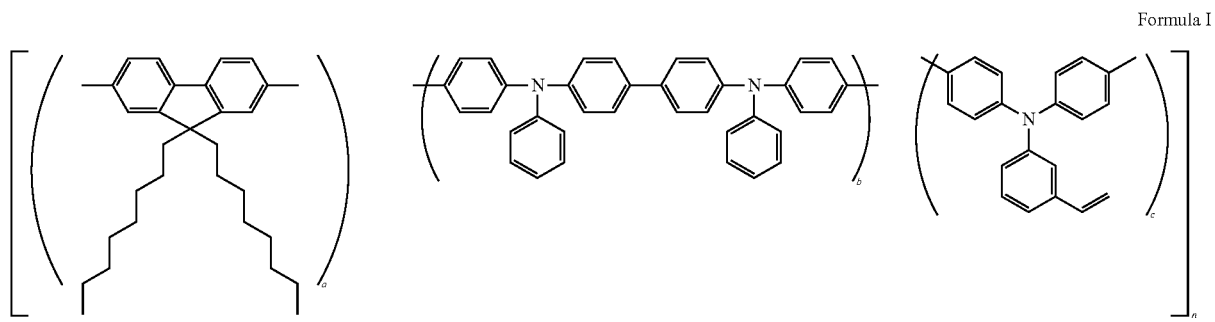
Formula I
from the group consisting of Formula I and Formula II
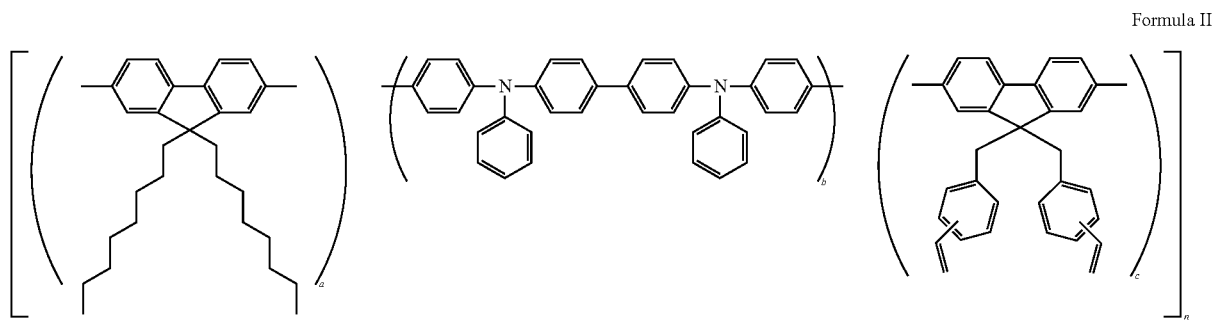
Formula II
wherein:
a, b, and c are in the range of 1-10; and
n is a non-zero integer of at least 2.
5. The device of claim 1, wherein the hole transport layer comprises a polymer selected from the group consisting of P1 through P7:
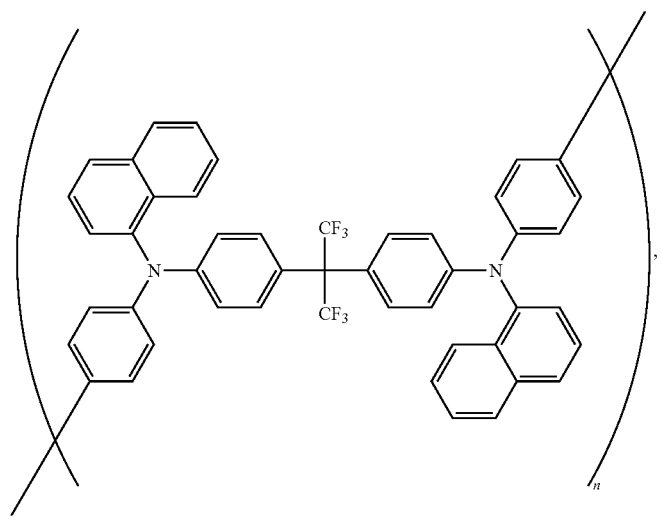
P1
$C_{49}H_{36}F_6N_2$
Exact Mass: 766.28
Mol. Wt.: 766.81

-continued
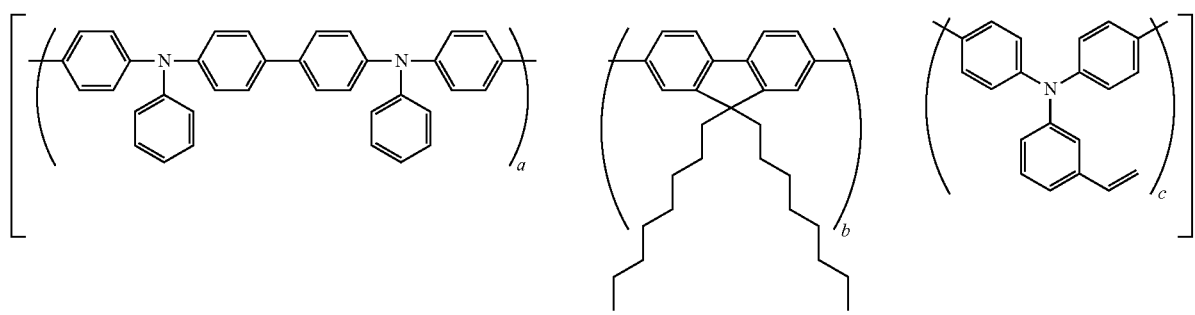
a:b:c = 2:2:1
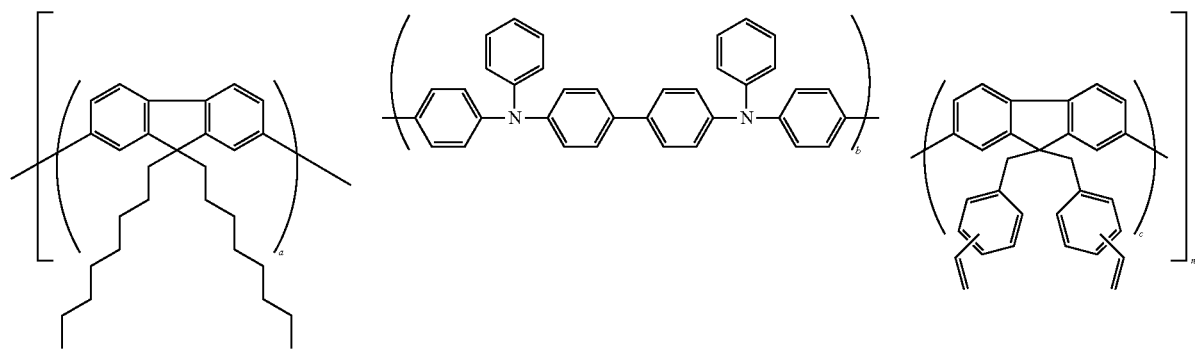
a:b:c = 4:5:1
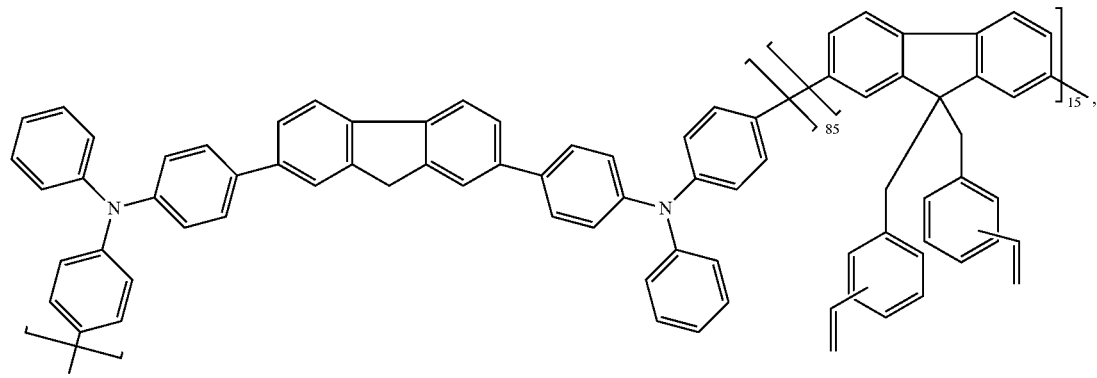

-continued

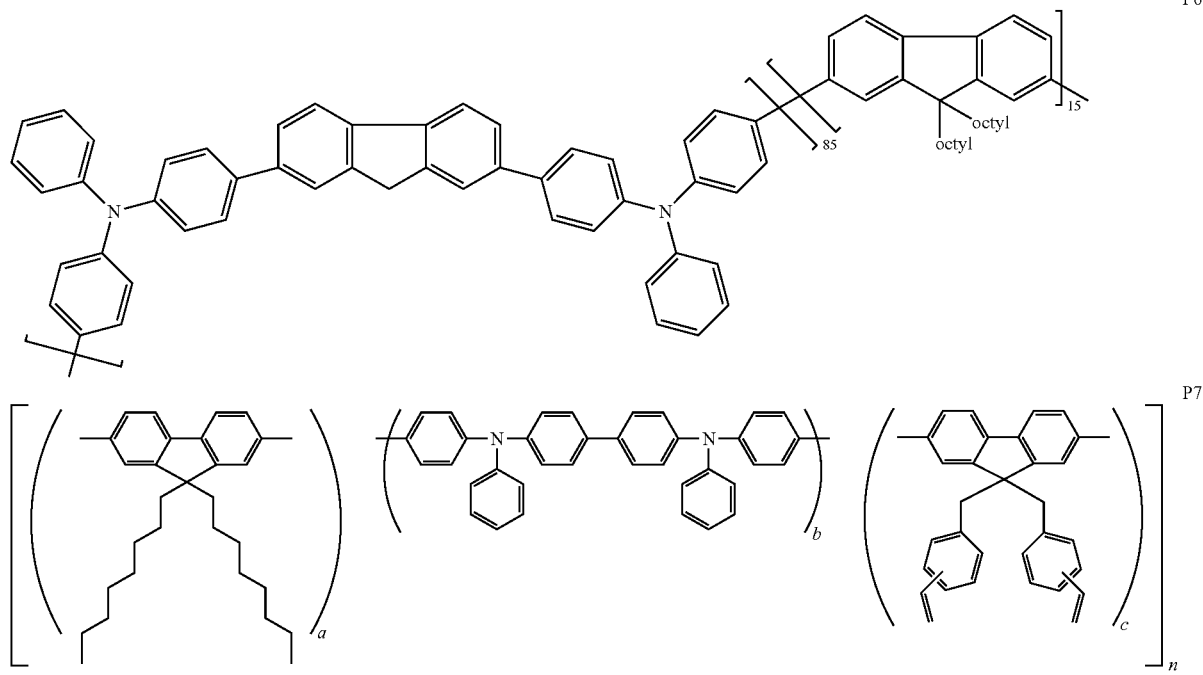

a:b:c = 3:5:2

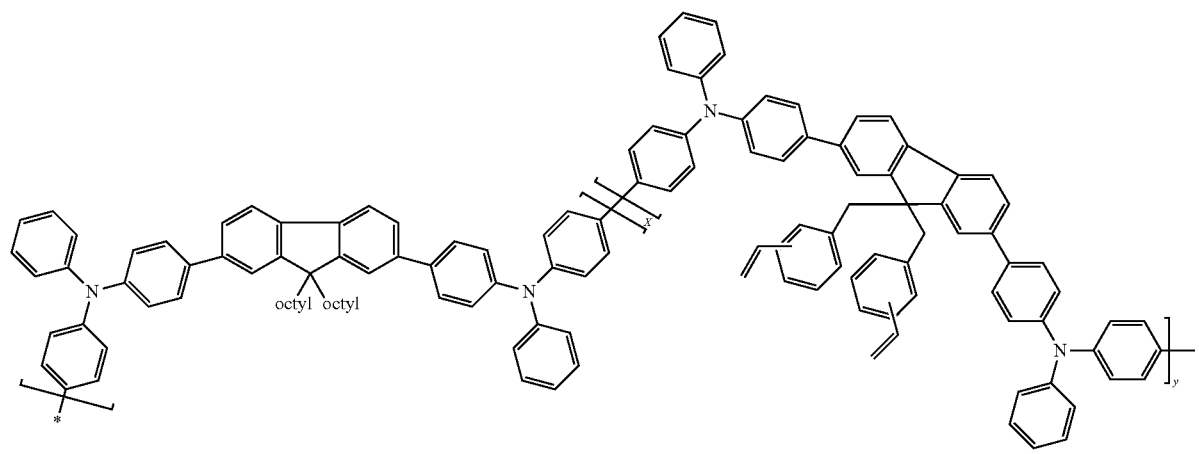

6. The device of claim 1, which further comprises a buffer layer comprising a conductive polymer and a fluorinated acid polymer.

7. An organic electronic device comprising an anode and a cathode and having organic layers therebetween, wherein the organic layers are, in order:
 a buffer layer comprising a conductive polymer and a fluorinated acid polymer;
 a hole transport layer;
 a photoactive layer comprising a dopant material and a host material, wherein said host material has an HPLC purity of at least 99.9% and an impurity absorbance no greater than 0.01; and
 an electron transport layer.

8. The device of claim 7, wherein each of the buffer layer, the hole transport layer and the photoactive layer are formed by solution deposition.

9. The device of claim 7, wherein said dopant material is selected from the formulae below:

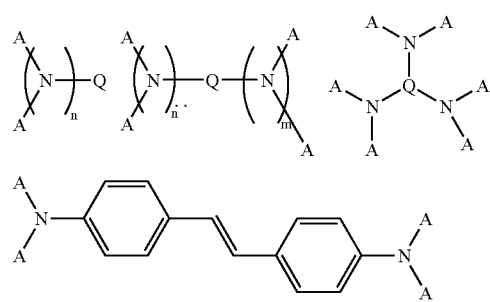

where:
  A is the same or different at each occurrence and is an aromatic group having from 3-60 carbon atoms;
  Q is a single bond or an aromatic group having from 3-60 carbon atoms;
  n and m are independently an integer from 1-6.

10. The device of claim 9, wherein Q is independently selected from the group consisting of phenyl, tolyl, naphthyl, and anthracenyl groups.

11. The device of claim 9, wherein A is selected from the group consisting of naphthalene, anthracene, chrysene, and rubrene.

12. The device of claim 9, wherein the dopant material is selected from the group consisting of E1 through E6:

E1

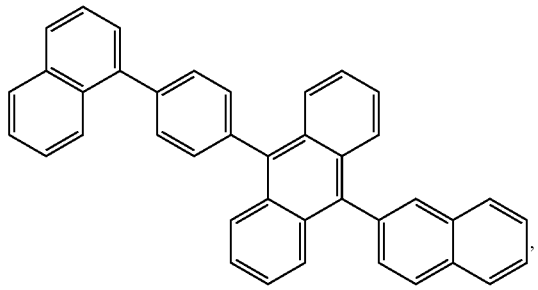 [SMILES: c1ccc2cc(-c3c4ccccc4c(-c4ccc(-c5cccc6ccccc56)cc4)c4ccccc34)ccc2c1]

E2

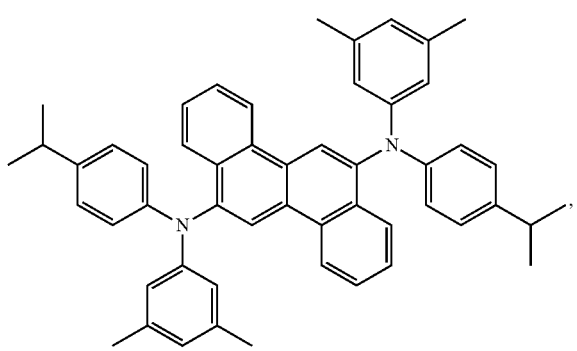

E3

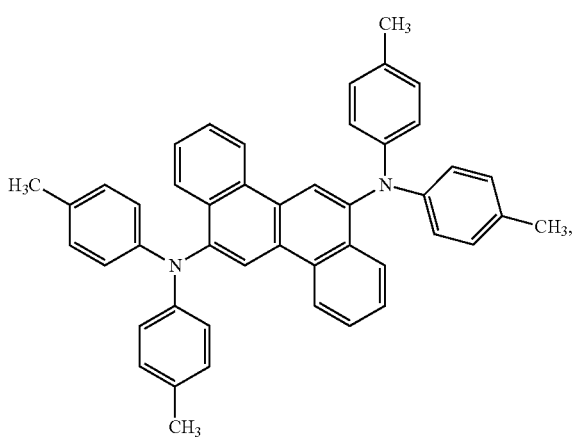

E4

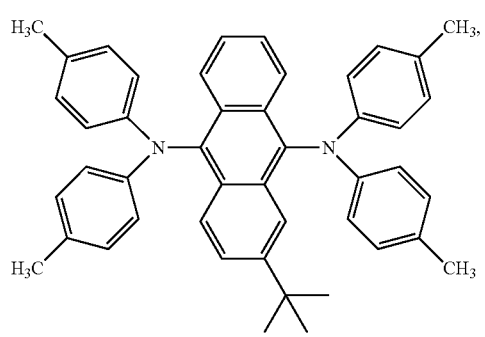

E5

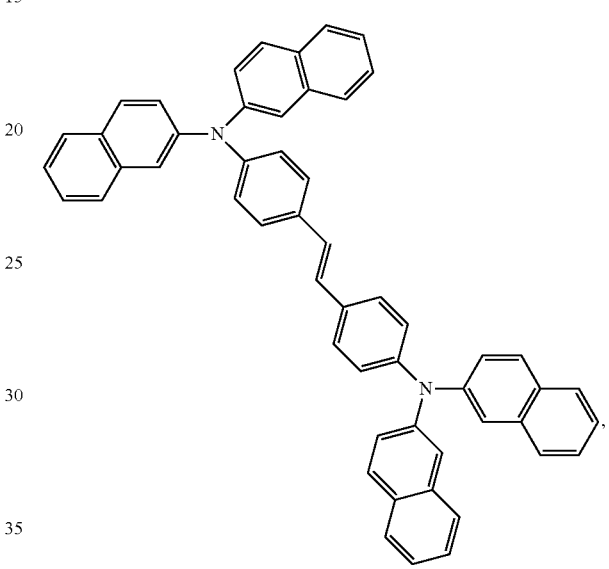

E6 and 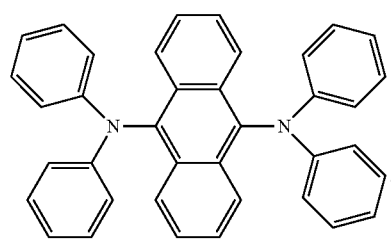

13. The device of claim 7, wherein said host material is a bis-condensed cyclic aromatic compound.

14. The device of claim 13, wherein the host is an anthracene derivative compound having the formula:

An-L-An where:
  An is an anthracene moiety; and
  L is a divalent connecting group.

15. The device of claim 14, wherein L is selected from the group consisting of a single bond, —O—S—, —N(R)—, and an aromatic group.

16. The device of claim 13, wherein the host is an anthracene derivative compound having the formula:

A-An-A where:
  An is an anthracene moiety; and
  A is an aromatic group.

17. The device of claim 13, wherein the host has the formula:

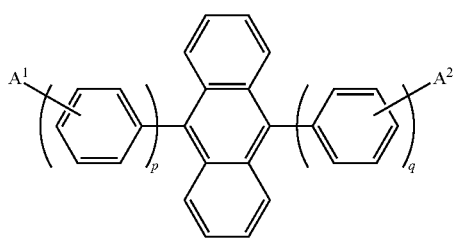

where:
A¹ and A² are the same or different at each occurrence and are selected from the group consisting of H, an aromatic group, and an alkenyl group, or A may represent one or more fused aromatic rings;
p and q are the same or different and are an integer from 1-3.

18. The device of claim 13, wherein the host is selected from the group consisting of

H1

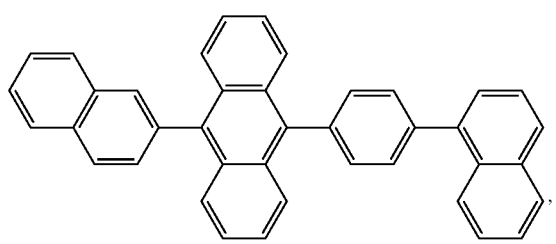

H2

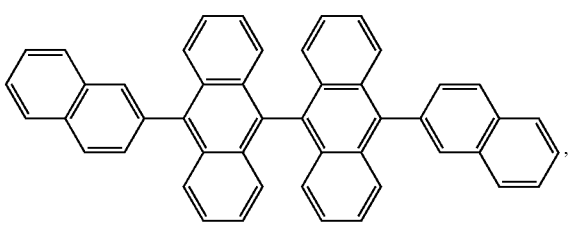

and combinations thereof.

19. The device of claim 13, wherein the hole transport layer comprises a polymer selected from the group consisting of arylamine polymers and copolymers of fluorene and arylamine monomers.

20. The device of claim 19, wherein the polymer is crosslinked.

21. The device of claim 13, wherein the polymer is selected from the group consisting of Formula I and Formula II Formula I

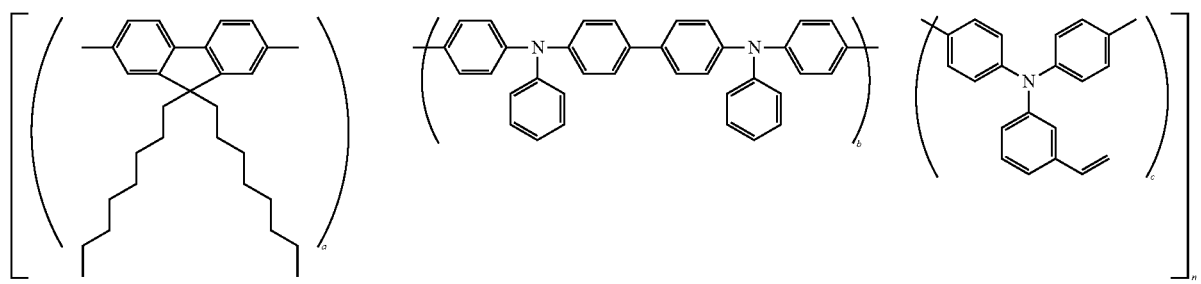

Formula II
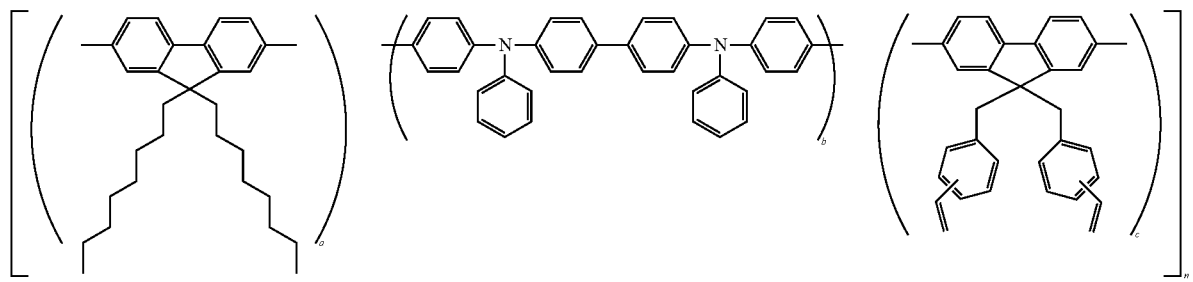
wherein:
a, b, and c are in the range of 1-10; and
n is a non-zero integer of at least 2.
22. The device of claim 13, wherein the hole transport polymer is selected from the group consisting of P1 through P7:
P1:
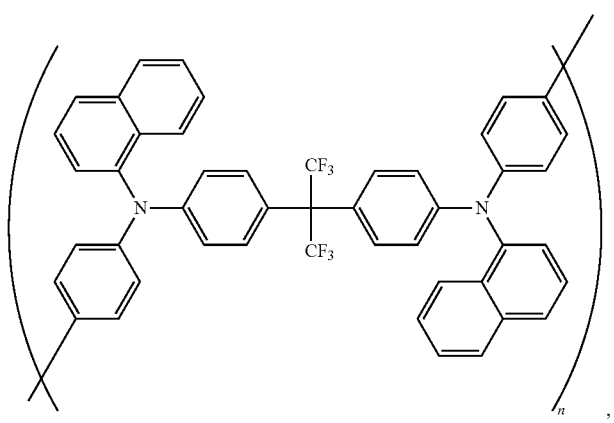
$C_{49}H_{36}F_6N_2$
Exact Mass: 766.28
Mol. Wt.: 766.81
P2:
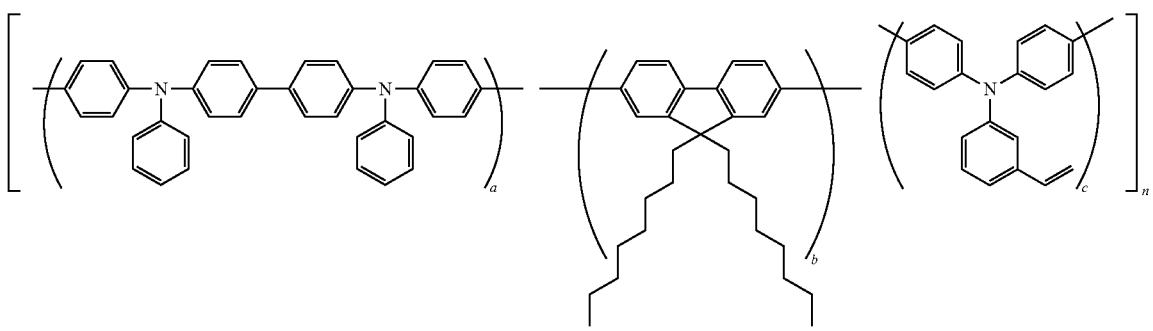
$a:b:c: = 2:2:1$ -continued
P3:
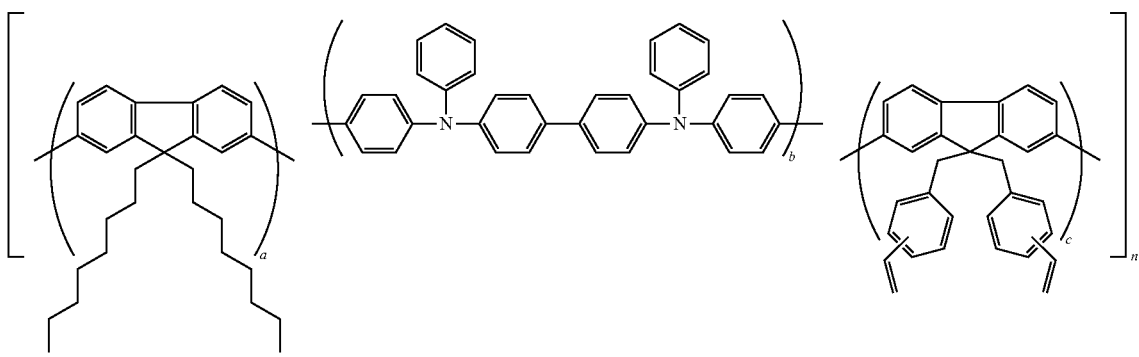
a:b:c: = 4:5:1
P4:
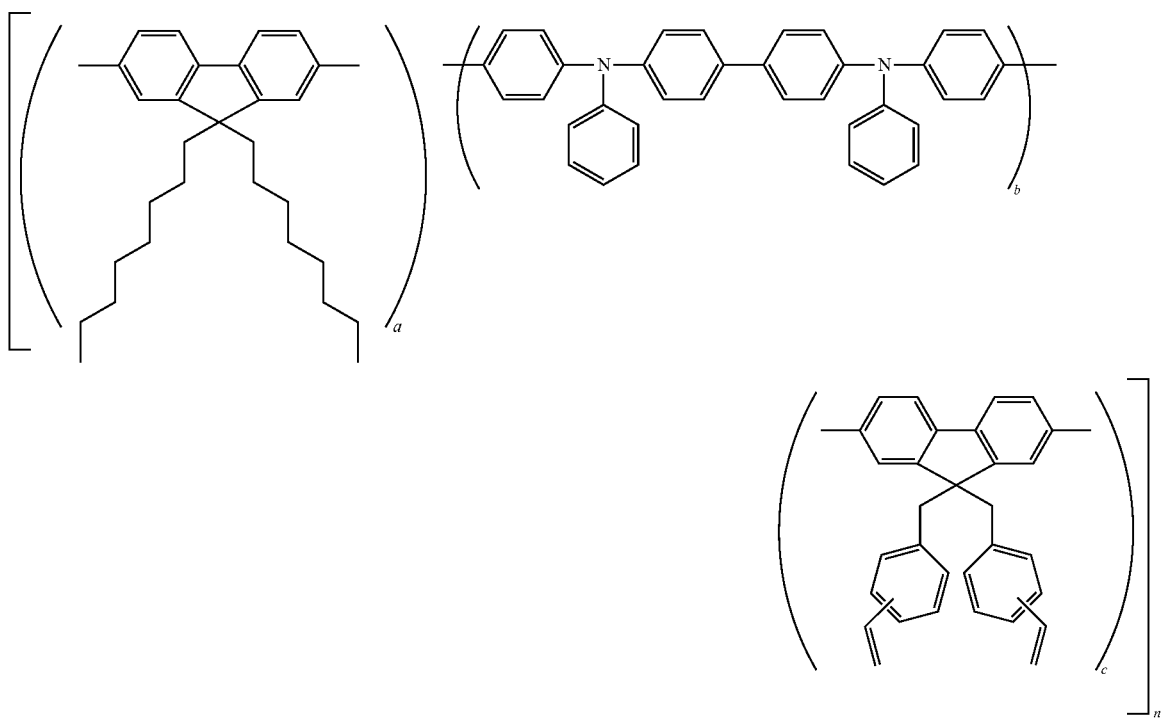
a:b:c: = 3:5:2
P5:
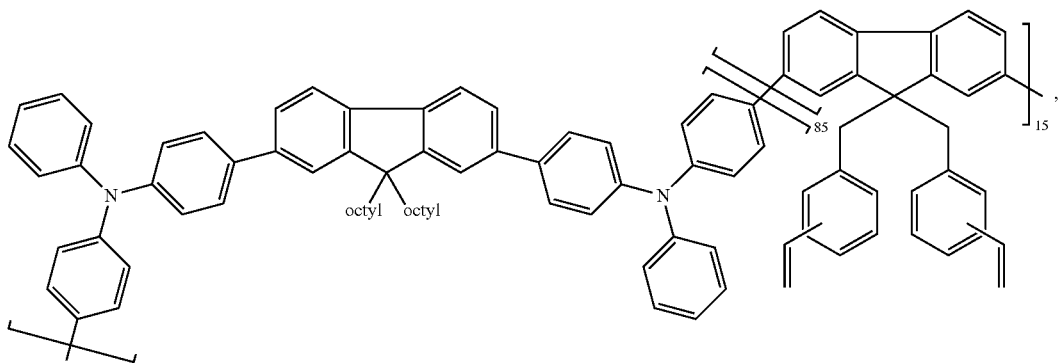

P6:
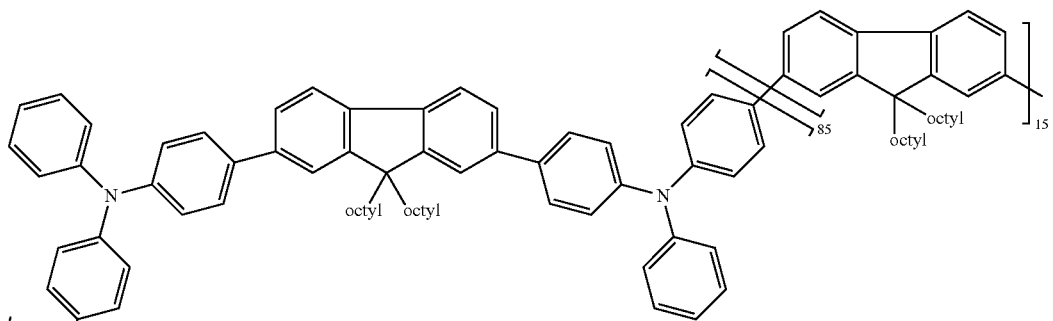
P7:
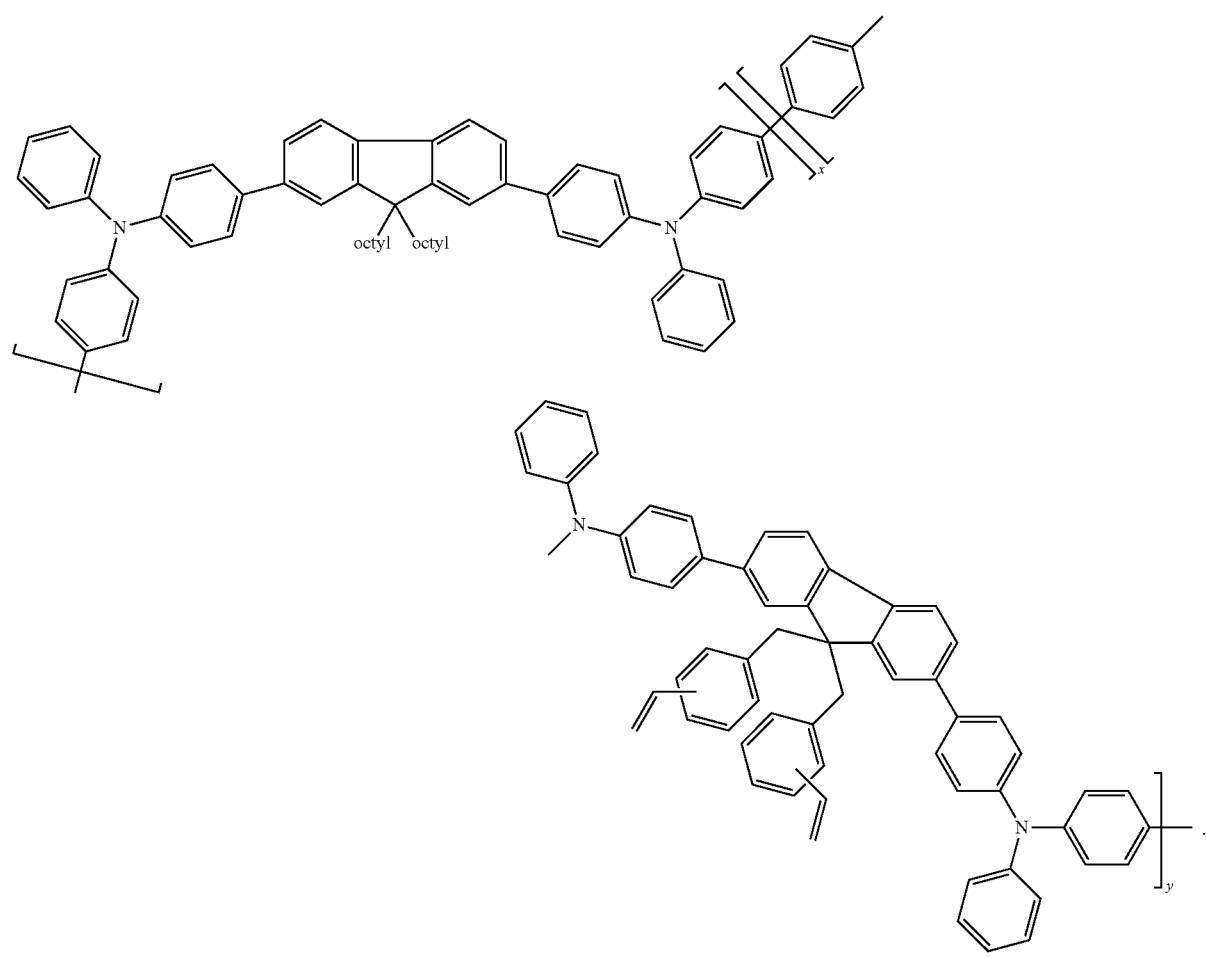
* * * * *